US006642576B1

(12) United States Patent
Shirasawa et al.

(10) Patent No.: US 6,642,576 B1
(45) Date of Patent: Nov. 4, 2003

(54) POWER SEMICONDUCTOR DEVICE HAVING LAYERED STRUCTURE OF POWER SEMICONDUCTOR ELEMENTS AND TERMINAL MEMBERS

(75) Inventors: Takaaki Shirasawa, Tokyo (JP); Yasuo Koutake, Fukuoka (JP); Tsuyoshi Takayama, Fukuoka (JP); Natsuki Tsuji, Hiroshima (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/330,438

(22) Filed: Dec. 30, 2002

(30) Foreign Application Priority Data

Jul. 15, 2002 (JP) ........................................ 2002-205099

(51) Int. Cl.[7] .............................................. H01L 29/76
(52) U.S. Cl. ....................... 257/328; 257/327; 257/288; 257/678; 257/690
(58) Field of Search ................................. 257/328, 327, 257/288, 678, 690

*Primary Examiner*—Long Pham
(74) *Attorney, Agent, or Firm*—Oblon, Spivak, McClelland, Maier & Neustadt, P.C.

(57) ABSTRACT

An IGBT (121) and a diode (131) are joined onto an element arrangement portion (111a) of a first terminal member (111) and an element arrangement portion (112a) of a second terminal member (112) is joined onto the IGBT (121) and the diode (131). Further, an IGBT (122) and a diode (132) are joined onto the element arrangement portion (112a) of the second terminal member (112) and an element arrangement portion (113a) of a third terminal member (113) is joined onto the IGBT (122) and the diode (132). A transfer mold package (141) is so formed as to house the elements (121, 122, 131, 132). External connection portions (111b, 112b, 113b) of the terminal members (111, 112, 113) are drawn out of the package (141). The element arrangement portion(s) (111a, 113a) of the first and/or third terminal member (111, 113) are/is exposed out of the package (141).

16 Claims, 27 Drawing Sheets

FIG. 5
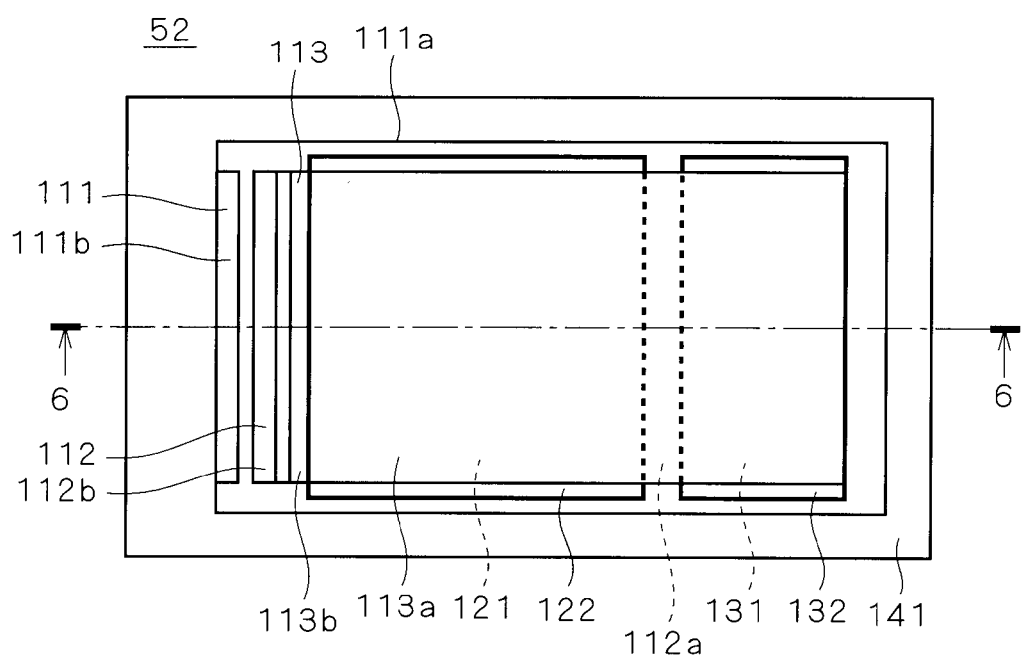
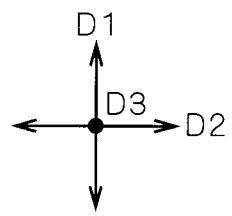

FIG. 7
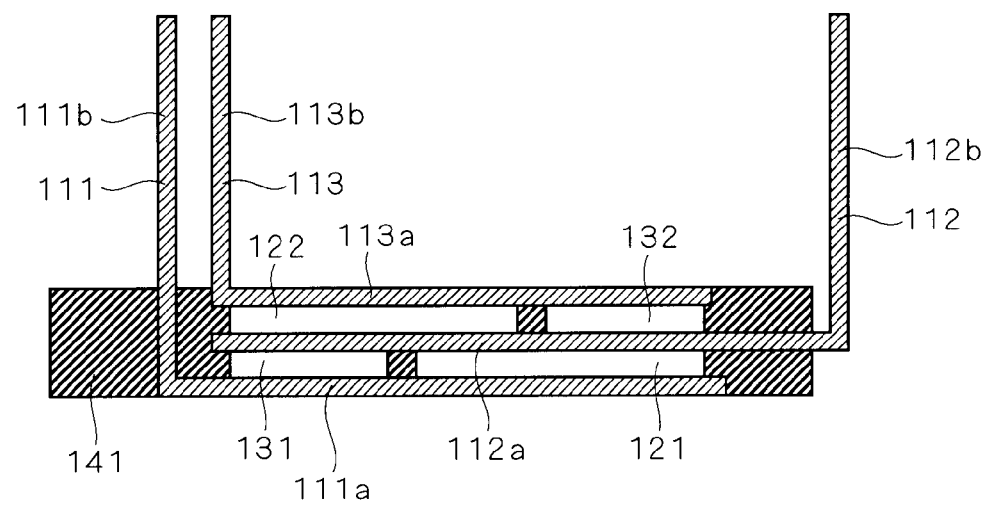
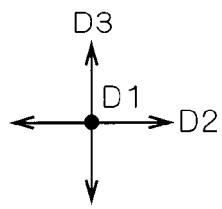

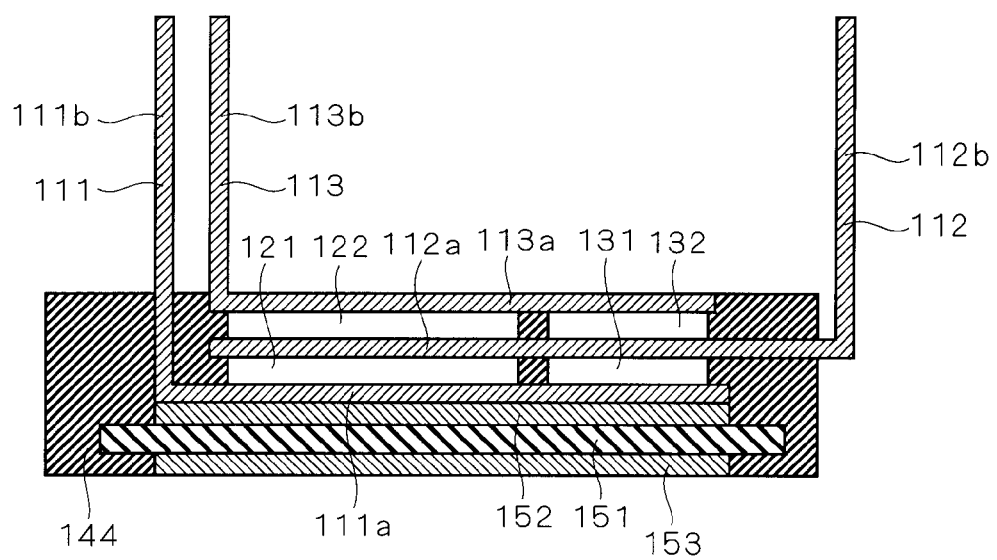
FIG. 10
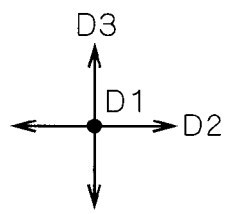

FIG. 11
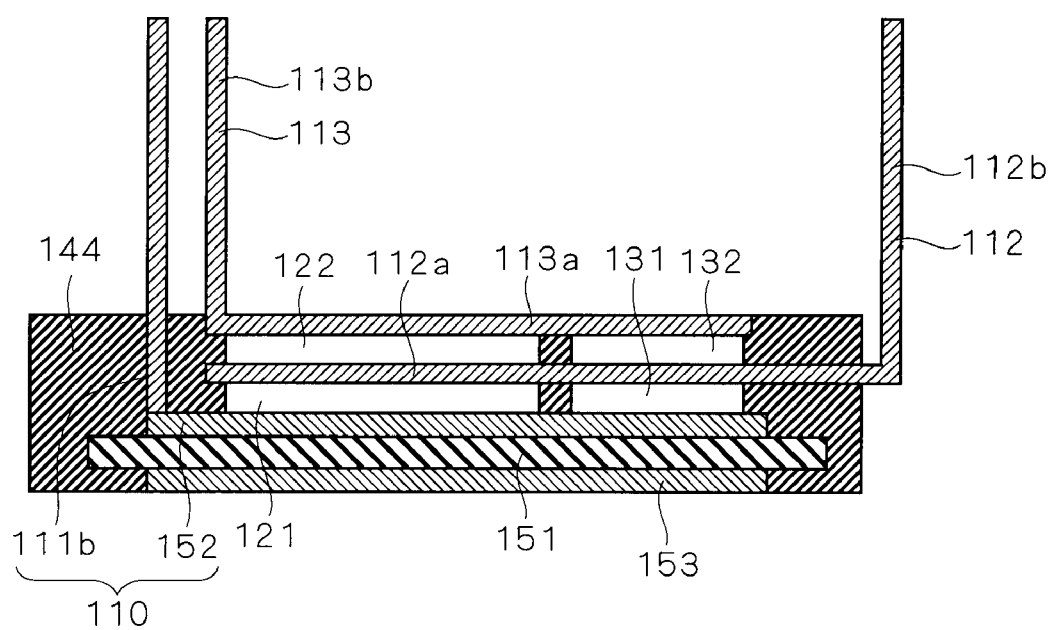
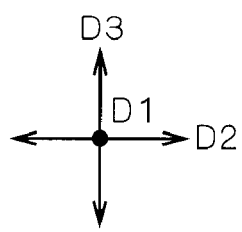

FIG. 12
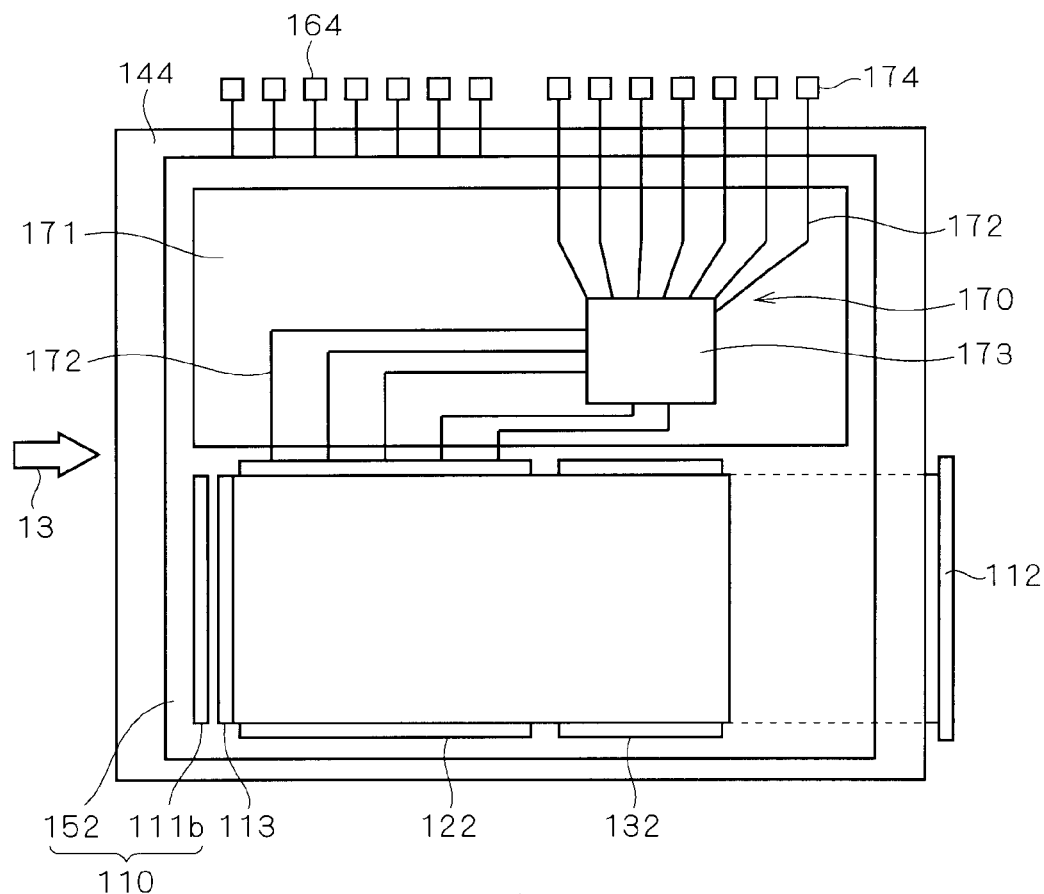
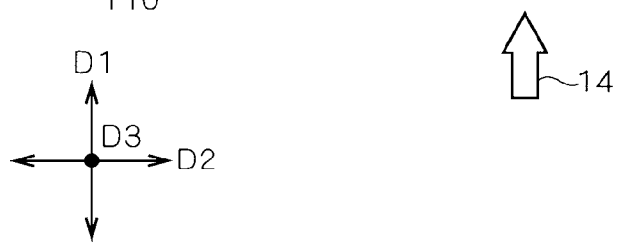

FIG. 14
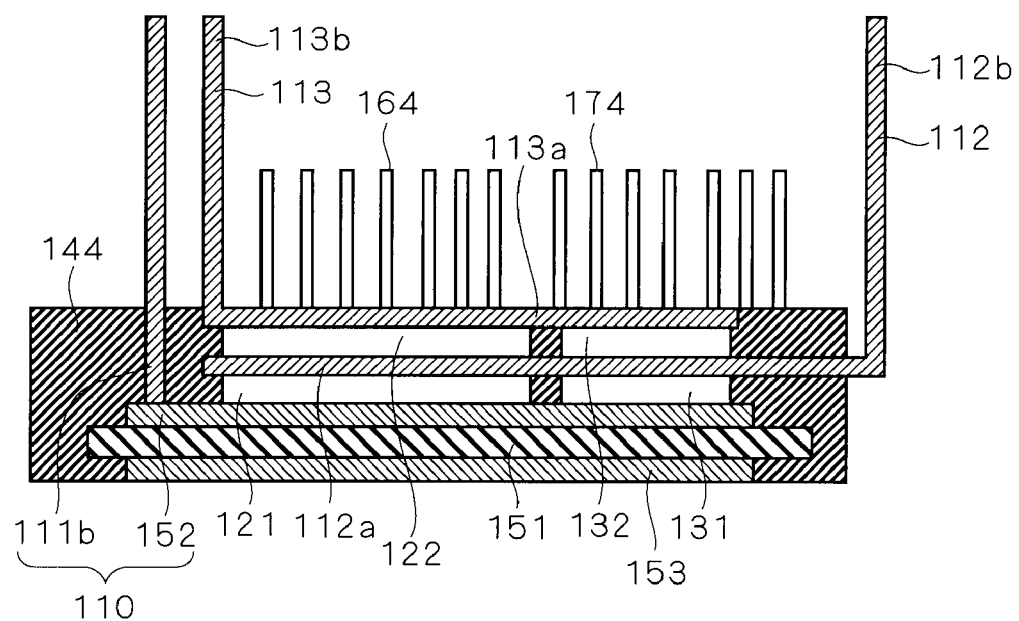
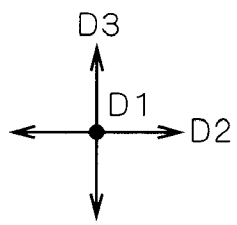

FIG. 16
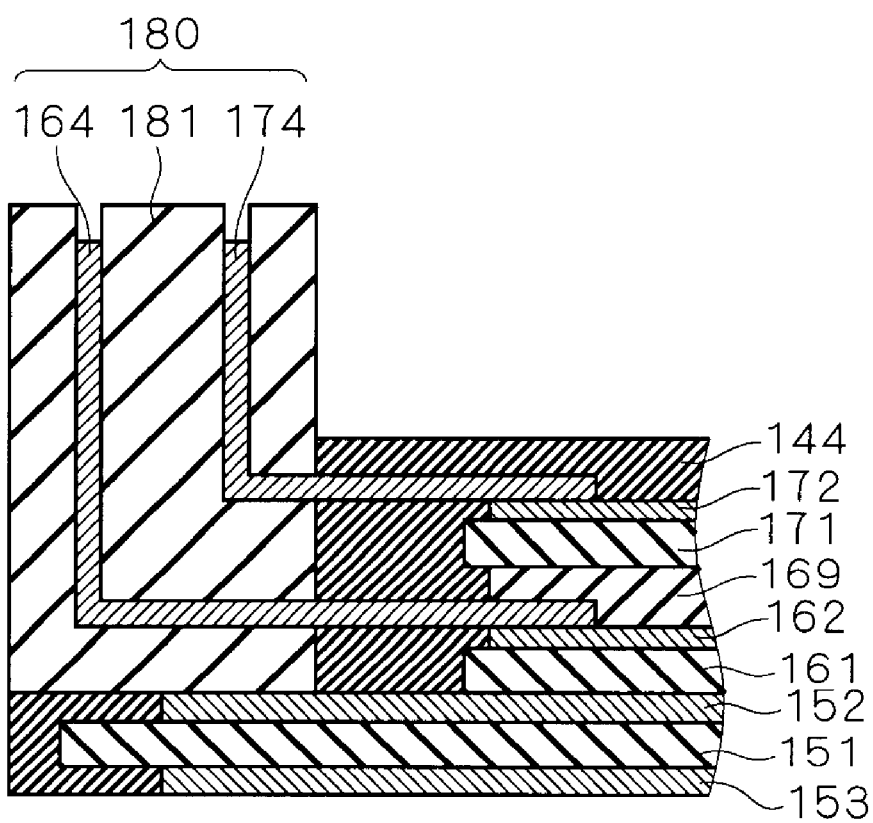
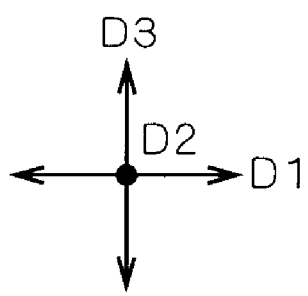

FIG. 17
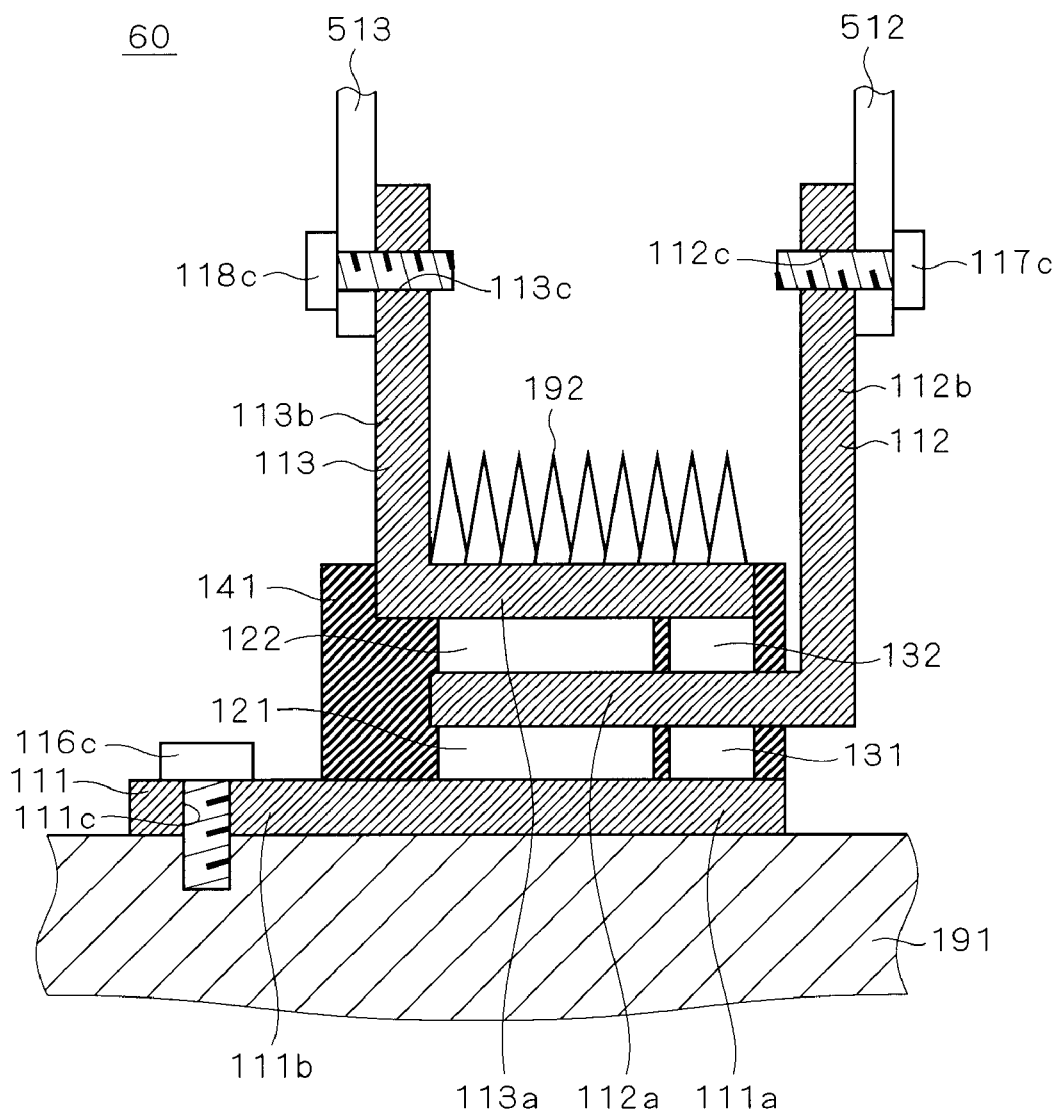
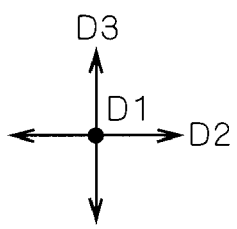

FIG. 25
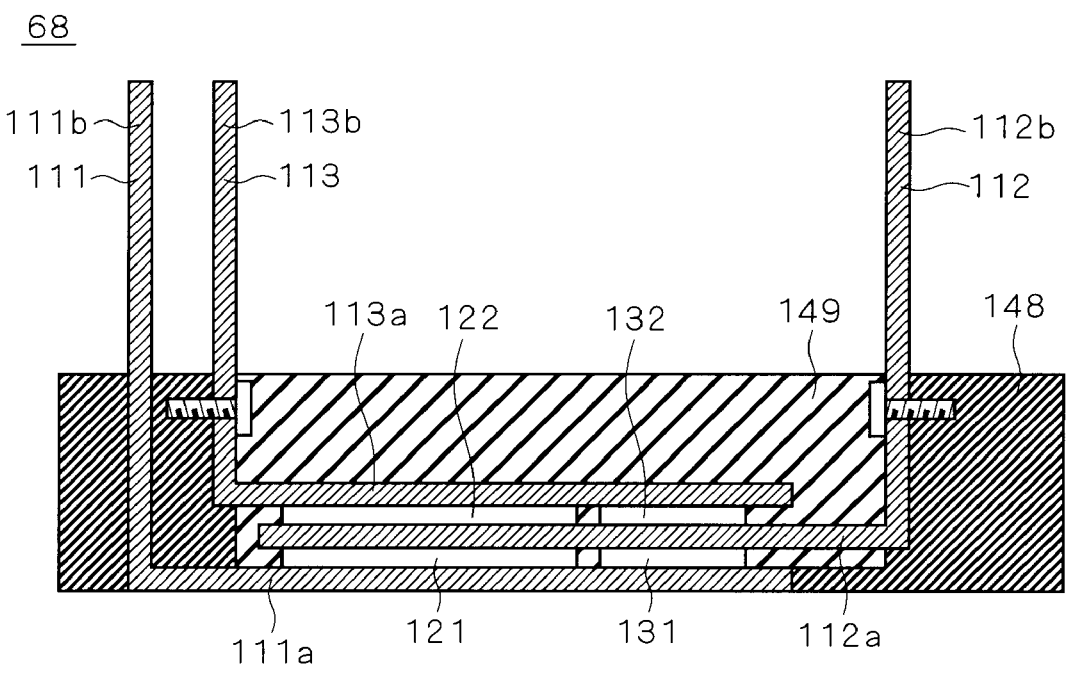
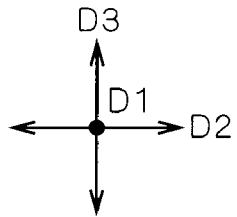

POWER SEMICONDUCTOR DEVICE HAVING LAYERED STRUCTURE OF POWER SEMICONDUCTOR ELEMENTS AND TERMINAL MEMBERS

TITLE OF THE INVENTION

Power Semiconductor Device Having Layered Structure of Power Semiconductor Elements and Terminal Members

BACKGROUND OF THE INVENTION

1. Field of the Invention

The present invention relates to a power semiconductor device, and more particularly to a technique to eliminate wire connection and solve problems caused by the wire connection.

2. Description of the Background Art

There is a need, recently, for a downsized and lightweight, low-cost and high-quality power semiconductor device. Though high quality generally costs a lot, it is desired to ensure high quality with cost reduction.

FIGS. 26 and 27 are schematic plan view and cross section illustrating a power semiconductor device 51P in the background art. Herein, as an example of the background-art power semiconductor device 51P, one-phase structure (one arm) of a three-phase inverter is taken. For simple illustration, a case body (resin member) is omitted in FIGS. 26 and 27.

In the background-art power semiconductor device 51P, metal layers 152P and 153P made of, e.g., copper or aluminum are disposed on both main surfaces of a radiating insulating substrate 151P made of, e.g., ceramic. The insulating substrate 151P is adhered onto a metal radiator plate (not shown) made of, e.g., copper or aluminum with solder.

On each metal layer 152P, IGBTs 121P and 122P and free wheeling diodes 131P and 132P are disposed (four power semiconductor elements 121P, 122P, 131P and 132P are disposed on a plane), being in an electric contact with the metal layer 152P. Wires 154P made of aluminum or gold establish connection between a pair of power semiconductor elements 121P and 131P and between another pair of power semiconductor elements 122P and 132P. Further, the power semiconductor elements 121P, 122P, 131P and 132P are connected to the metal layer 152P and terminals 155P and 155PP with the wires 154P. The metal layer 152P and a terminal 155NP are connected to each other with the wires 154P. The terminals 155NP and 155PP are connected to low potential (power-supply ground potential) and high potential, respectively.

A case (now shown) is so arranged as to house the power semiconductor elements 121P, 122P, 131P and 132P and filled with epoxy resin. At this time, in some cases, the power semiconductor elements 121P, 122P, 131P and 132P are sealed by silicone gel and the epoxy resin fills thereon.

The background-art power semiconductor device 51P has the following problems caused by the wires 154P.

First, disconnection is disadvantageously caused by a break of the wire 154P. For example, when the power semiconductor device 51P is used in automobile, motorbike, train or the like, vibrations sometimes cause a crack in a neck portion of a wire, resulting in disconnection.

Further, the need for providing connecting portions of the wires 154P causes upsizing of the power semiconductor device 51P.

Furthermore, a voltage drop of the wire 154P causes a power loss.

SUMMARY OF THE INVENTION

It is a main object of the present invention to provide a power semiconductor device having no wire connection.

According to the present invention, a power semiconductor device includes first to third terminal members, at least one first power semiconductor element, and at least one second power semiconductor element. The first to third terminal members each include an element arrangement portion having first and second main surfaces which are opposed to each other. The at least one first power semiconductor element has first and second main surfaces which are opposed to each other and first and second main electrodes provided on the first and second main surfaces, respectively. The at least one second power semiconductor element has first and second main surfaces which are opposed to each other and first and second main electrodes provided on the first and second main surfaces, respectively. The at least one first power semiconductor element has the same structure as the at least one second power semiconductor element. The second main surface in the element arrangement portion of the first terminal member is joined to the first main electrode of the at least one first power semiconductor element. The second main electrode of the at least one first power semiconductor element is joined to the first main surface in the element arrangement portion of the second terminal member. The second main surface in the element arrangement portion of the second terminal member is joined to the first main electrode of the at least one second power semiconductor element. The second main electrode of the at least one second power semiconductor element is joined to the first main surface in the element arrangement portion of the third terminal member. The power semiconductor device further includes a package for housing the at least one first power semiconductor element and the at least one second power semiconductor element. The first to third terminal members each have an external connection portion drawn out of the package.

Since the terminal members and the power semiconductor elements are alternately layered, being joined to one another, and the external connection portions of the terminal members are drawn out of the package, it is possible to provide a power semiconductor device having no wire connection. Therefore, according to the power semiconductor device of the present invention, it is possible to solve the problems caused by the wire connection. Further, while a manufacturing time becomes longer as the number of wires (depending on the current rating) increases, the power semiconductor device of the present invention has a structure in which the terminal members and the power semiconductor elements are joined to one another regardless of the current rating and thereby shows outstanding productivity. Furthermore, such a structure as discussed above in which the terminal members and the power semiconductor elements are alternately layered ensures downsizing. Moreover, since the first power semiconductor element and the second power semiconductor element have the same structure and there is no need for preparing any power semiconductor element of different structure, it is possible to reduce the cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic plan view illustrating a second power semiconductor device in accordance with the first preferred embodiment;

FIG. 7 is a schematic cross section illustrating a third power semiconductor device in accordance with the first preferred embodiment;

FIG. 10 is a schematic cross section illustrating a third power semiconductor device in accordance with the second preferred embodiment;

FIG. 11 is a schematic cross section illustrating a fourth power semiconductor device in accordance with the second preferred embodiment;

FIG. 12 is a schematic plan view illustrating a first power semiconductor device in accordance with a third preferred embodiment;

FIG. 14 is a schematic cross section of the first power semiconductor device in accordance with the third preferred embodiment as viewed from the direction of an arrow 14 of FIG. 12;

FIG. 16 is a schematic cross section illustrating the second power semiconductor device in accordance with the third preferred embodiment;

FIG. 17 is a schematic cross section illustrating a first power semiconductor device in accordance with a fourth preferred embodiment;

FIG. 25 is a schematic cross section illustrating a power semiconductor device in accordance with a first variation common to the first to sixth preferred embodiments;

DESCRIPTION OF THE PREFERRED EMBODIMENTS

The First Preferred Embodiment

Figure 1:
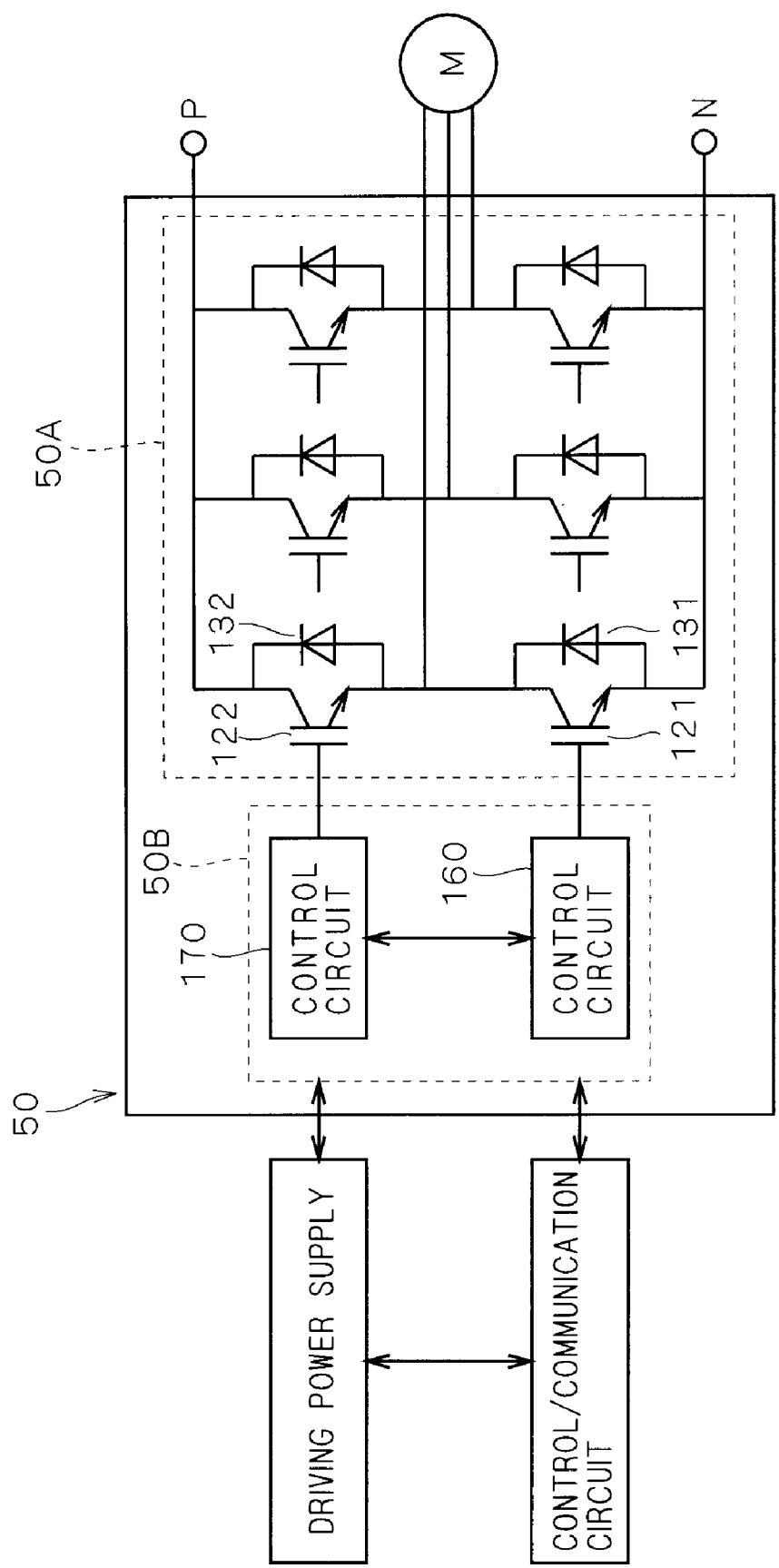
FIG. 1 is a block diagram illustrating a power semiconductor device in accordance with the present invention.

FIG. 1 is a block diagram illustrating a power semiconductor device 50 in accordance with the present invention. As shown in FIG. 1, the power semiconductor device 50 is broadly divided into a power element part 50A and a control part 50B.

Herein, as an example of the power element part 50A, a three-phase (three-arm) inverter is taken. One phase, i.e., one arm of the inverter consists of a high-side arm (upper arm) and a low-side arm (lower arm) which are connected in series to each other.

The low-side arm includes a first switching power semiconductor element 121 and a first free wheeling diode (hereinafter, also referred to simply as "(first) diode") 131, as first power semiconductor elements, respectively. An IGBT (Insulated Gate Bipolar Transistor) is taken as an example of the first switching power semiconductor element 121. The diode 131 is connected in parallel to the IGBT 121 in a direction where a forward current returns (circulates), in other words, connected in inverse parallel. Specifically, emitter and collector of the IGBT 121 are connected to anode and cathode of the diode 131, respectively.

The high-side arm includes a second switching power semiconductor element 122 and a second free wheeling diode (hereinafter, also referred to simply as "(second) diode") 132, as second power semiconductor elements, respectively. An IGBT is taken as an example of the second switching power semiconductor element 122. Like in the low-side arm, the IGBT 122 and the diode 132 are connected in inverse parallel.

A node between the high-side arm and the low-side arm corresponds to an out put terminal. A collector of the IGBT 122 in the high-side arm is connected to a high potential P and the emitter of the IGBT 121 in the low-side arm is connected to a low potential N (herein, power-supply ground potential GND).

The control part 50B includes a low-side control circuit 160 connected to a gate of the IGBT 121 and a high-side control circuit 170 connected to a gate of the IGBT 122. For simple illustration, FIG. 1 shows only the control circuits 160 and 170 of one arm. The control circuits 160 and 170 drive the IGBTs 121 and 122, respectively, by controlling these IGBTs 121 and 122 to turn on/off at a predetermined timing. Further, the control circuit 160 sometimes includes a protection circuit of the low-side arm and the control circuit 170 sometimes includes a protection circuit of the high-side arm. The power semiconductor device 50 is connected to a driving power supply and a control/communication circuit outside the device.

Figure 2:
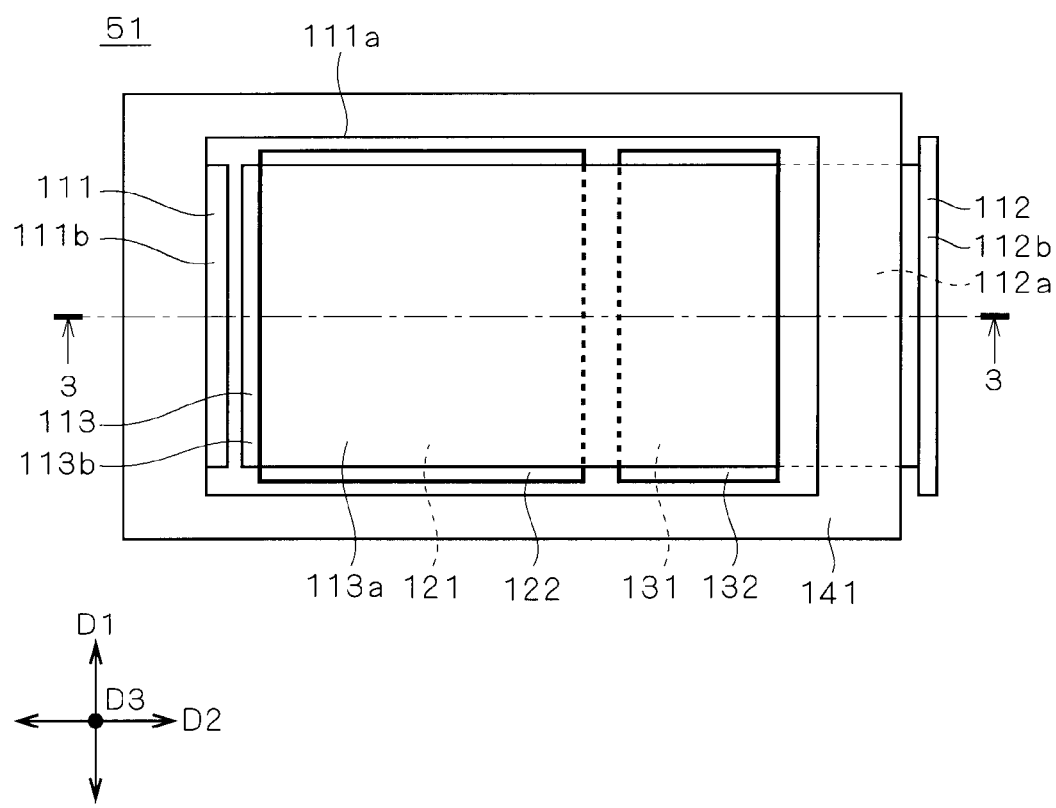
FIG. 2 is a schematic plan view illustrating a first power semiconductor device in accordance with a first preferred embodiment.
Figure 3:
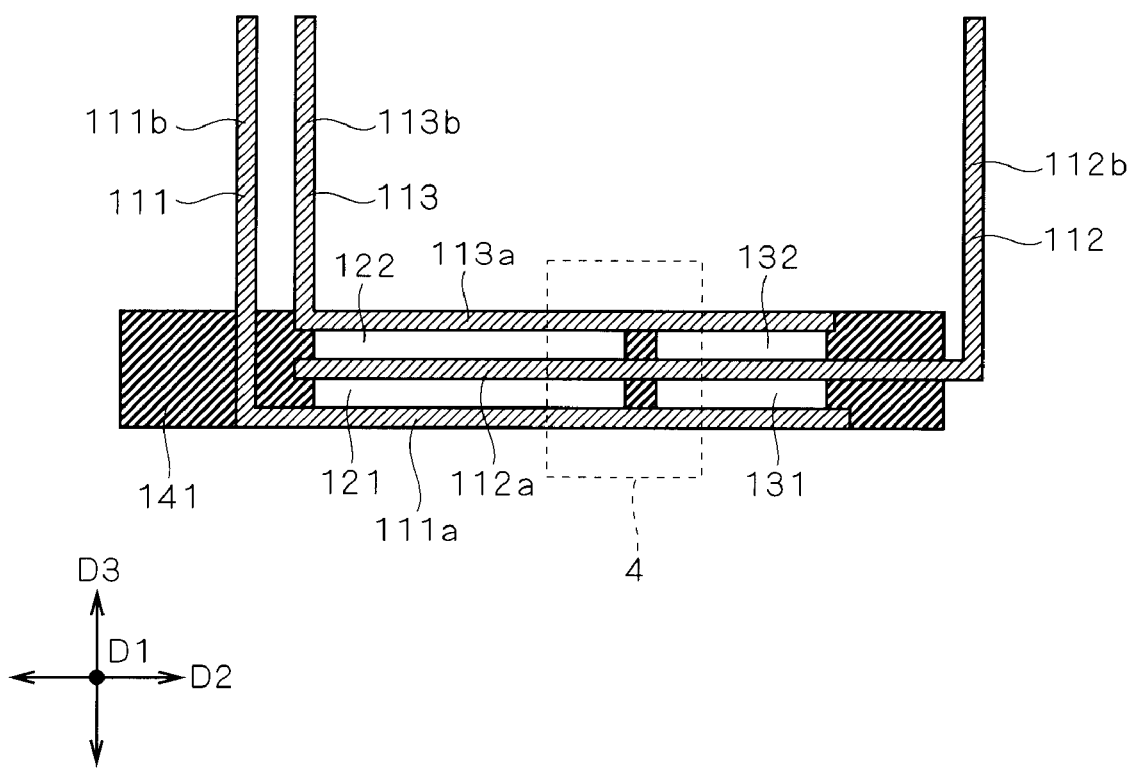
FIG. 3 is a schematic cross section taken along the line 3—3 of FIG. 2.
Figure 4:
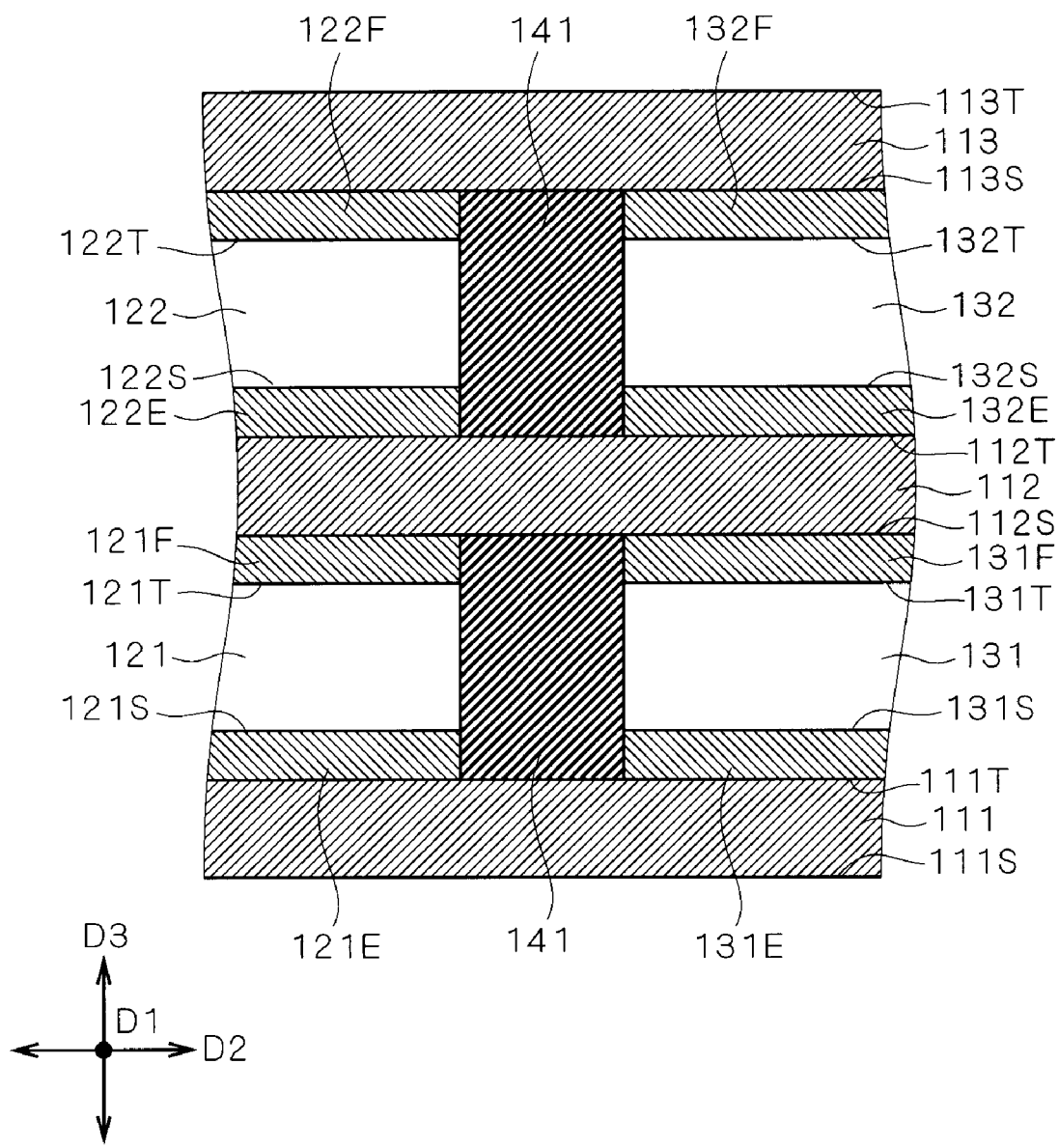
FIG. 4 is an enlarged view of a portion 4 surrounded by a broken line of FIG. 3.

FIG. 2 is a schematic plan view (layout view) illustrating a basic structure of a first power semiconductor device 51 in accordance with the first preferred embodiment of the present invention. In FIG. 2, some elements are shown through and the same applies to the following plan views. FIG. 3 is a schematic cross section taken along the line 3—3 of FIG. 2 and FIG. 4 is an enlarged view of a portion 4 surrounded by a broken line of FIG. 3. The power semiconductor device 51 corresponds to one arm of the power semiconductor device 50 of FIG. 1.

As shown in FIGS. 2 to 4, th power semiconductor device 51 includes first to third terminal members 111, 112 and 113, the first and second IGBTs 121 and 122, the first and second diodes 131 and 132 and a transfer mold package 141.

In more detail, the first terminal member 111 has a shape in which a conductive sheet material (having thickness of, e.g., about 0.3 to 0.5 mm) made of, e.g., copper or aluminum, having first and second main surfaces 111S and 111T which are opposed to each other, is bent in a substantial L-shape as viewed from side (or as cross-sectionally viewed) and is broadly divided into two portions 111a and 111b with the bend (or ridgeline) as a dividing line. Herein, for convenience of discussion, it is assumed that a direction along the ridgeline of the terminal member 111 is a first direction D1 and directions where the above portions 11a and 11b extend from the ridgeline are a second direction D2 and a third direction D3, respectively.

Similarly, the second terminal member 112 is also formed of a conductive sheet material which is bent in a substantial L-shape, having first and second main surfaces 112S and 112T which correspond to the above first and second main surfaces 111S and 111T, respectively, and two portions 112a and 112b which are correspond to the above two portions 111a and 111b, respectively. The third terminal member 113 is also formed of a conductive sheet material which is bent in a substantial L-shape, having first and second main surfaces 113S and 113T which are correspond to the above first and second main surfaces 111S and 111T, respectively, and two portions 113a and 113b which are correspond to the above two portions 111a and 111b, respectively.

A semiconductor chip of the first IGBT 121 has first and second main surfaces 121S and 121T which are opposed to each other, and first and second main electrodes 121E and 121F are formed on the main surfaces 121S and 121T, respectively. Similarly, a semiconductor chip of the second IGBT 122 also has first and second main surfaces 122S and 122T which are opposed to each other, and first and second main electrodes 122E and 122F are formed on the main surfaces 122S and 122T, respectively.

A semiconductor chip of the first diode 131 has first and second main surfaces 131S and 131T which are opposed to each other, and first and second main electrodes 131E and 131F are formed on the main surfaces 131S and 131T, respectively. Similarly, a semiconductor chip of the second diode 132 also has first and second main surfaces 132S and 132T which are opposed to each other, and first and second main electrodes 132E and 132F are formed on the main surfaces 132S and 132T, respectively.

The first main electrodes 121E and 131E of the first IGBT 121 and the first diode 131 are joined in common to the second main surface 111T of one portion 111a of the first terminal member 111 with, e.g., solder. In this case, the IGBT 121 and the diode 131 are arranged in the second direction D2 and the IGBT 121 is disposed on the side of ridgeline.

The first main surface 112S of one portion 112a of the second terminal member 112 is so disposed as to face the one portion 111a of the first terminal member 111 with the IGBT 121 and the diode 131 interposed therebetween, and the main surface 112S is joined to the second main electrodes 121F and 131F of the IGBT 121 and the diode 131. In the power semiconductor device 51, the other portion 112b of the second terminal member 112 is disposed on the side of the diode 131. In other words, the other portions 111b and 11 2b of the terminal members 111 and 112 are so disposed as to be opposed to each other with the IGBT 121 and the diode 131 interposed therebetween as the IGBT 121 and the diode 131 are two-dimensionally viewed.

The first main electrodes 122E and 132E of the second IGBT 122 and the second diode 132 are joined to the second main surface 112T of one portion 112a of the second terminal member 112. In the power semiconductor device 51, the two IGBTs 121 and 122 are layered in the third direction D3 and the two diodes 131 and 132 are layered in the third direction D3. In other words, the two IGBTs 121 and 122 are opposed to each other with the one portion 112a of the terminal member 112, the two diodes 131 and 132 are opposed to each other with the same portion 112a interposed therebetween. On the other hand, the first IGBT 121 is not opposed to the second diode 132 in the third direction D3 with the portion 112a of the second terminal member 112 interposed therebetween, and similarly the second IGBT 122 is not opposed to the first diode 131 in the third direction D3.

The first main surface 113S of one portion 113a of the third terminal member 113 is so disposed as to face the one portion 112a of the second terminal member 112 with the IGBT 122 and the diode 132 interposed therebetween, and the main surface 113S is joined to the second main electrodes 122F and 132F of the IGBT 122 and the diode 132. In the power semiconductor device 51, the other portion 113b of the third terminal member 113 is disposed on the side of the IGBTs 121 and 122, like the portion 111b of the first terminal member 111.

The element arrangement portions 111a to 113a of the first to third terminal members 111 to 113 are patterned correspondingly to a plane pattern of the main electrodes 121E, 121F, 122E, 122F, 131E, 131F, 132E and 132F and later-discussed control electrodes 121G and 122G (see FIG. 13) as necessary.

The IGBTs 121 and 122 and the diodes 131 and 132 are sealed by the transfer mold package 141 and housed therein. In this case, the transfer mold package 141 is so formed as to cover side surfaces and end surfaces of the one portions 111a to 113a of the first to third terminal members 111 to 113. Further, in the power semiconductor device 51, the transfer mold package 141 is formed so that the first main surface 111S of the one portion 111a of the first terminal member 111 and the second main surface 113T of the one portion 113a of the third terminal member 113 may be exposed. On the other hand, at least end-side parts (farther away from the bend) of the other portions 11b to 113b of the first to third terminal members 111 to 113 are disposed outside the package 141. In the power semiconductor device 51, three other portions 111b to 113b protrude towards the same side in the third direction D3. The other portions 111b to 113b are connected to other external devices or the like.

In consideration of this structure, the one portions 111a to 113a of the first to third terminal members 111 to 113 are referred to as "element arrangement portions 111a to 113a" and the other portions 111b to 113b are referred to as "external connection portions 111b to 113b".

When the IGBT 121 and the diode 131 constitute the low-side arm as shown in the block diagram of FIG. 1, the first terminal member 111 is connected to the low potential N, the third terminal member 113 is connected to the high potential P and the second terminal member 112 corresponds to the output terminal. In this case, the first main electrodes 121E and 122E and the second main electrodes 121F and 122F of the IGBTs 121 and 122 correspond to the emitters and the collectors, respectively, and the first main electrodes 131E and 132E and the second main electrodes 131F and 132F of the diodes 131 and 132 correspond to the anodes and the cathodes, respectively.

On the other hand, in the power semiconductor device 51, the IGBT 121 and the diode 131 may constitute the high-side arm, and in this case, the first main electrodes 121E and 122E and the second main electrodes 121F and 122F of the IGBTs 121 and 122 correspond to the collectors and the emitters, respectively, and the first main electrodes 131E and 132E and the second main electrodes 131F and 132F of the diodes 131 and 132 correspond to the cathodes and the anodes, respectively. The first terminal member 111 is connected to the high potential P and the third terminal member 113 is connected to the low potential N.

The gates or the control electrodes of the IGBTs 121 and 122 will be discussed later, referring to FIG. 13.

Figure 26:
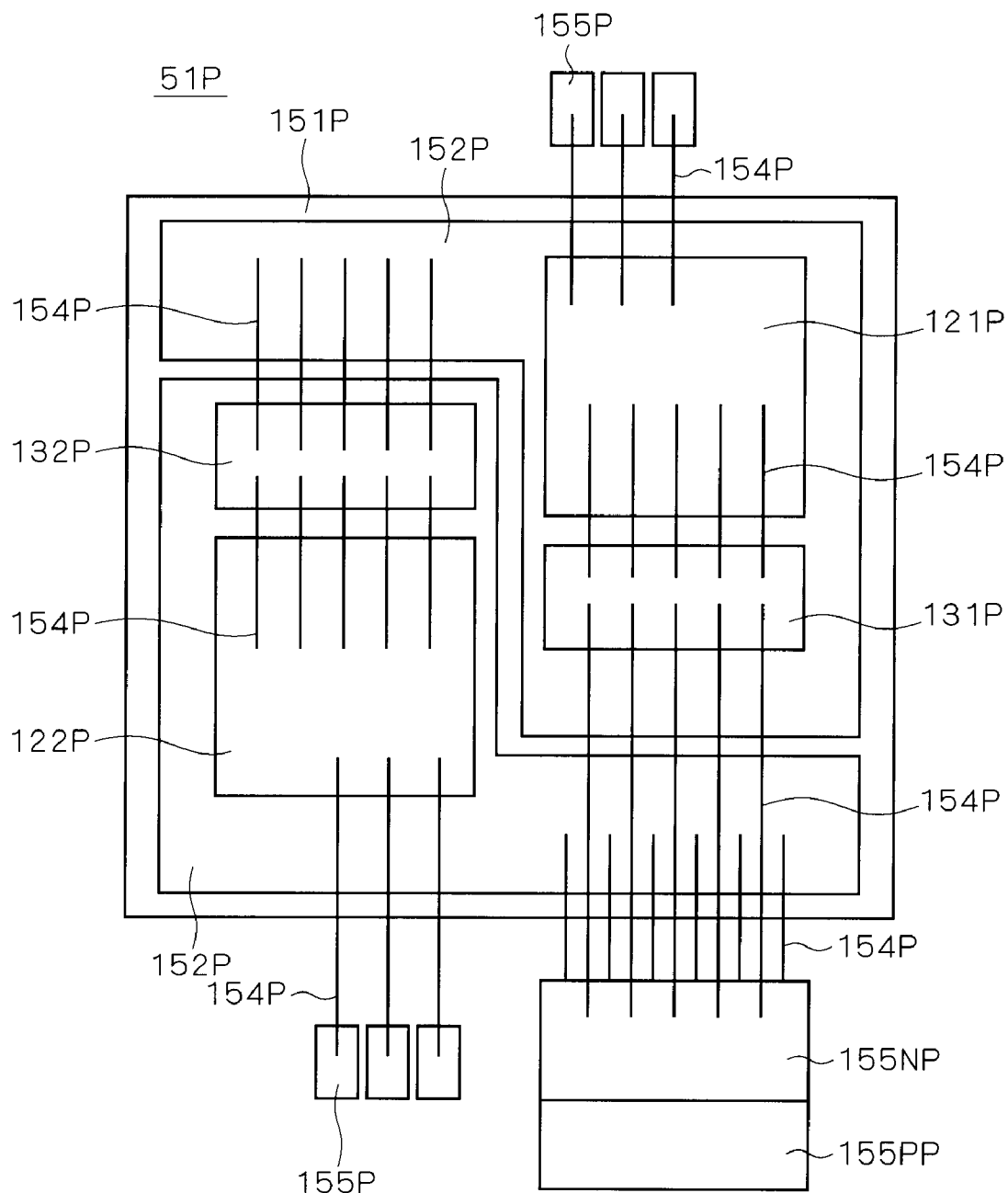
FIG. 26 is a schematic plan view illustrating a power semiconductor device in the background art.
Figure 27:
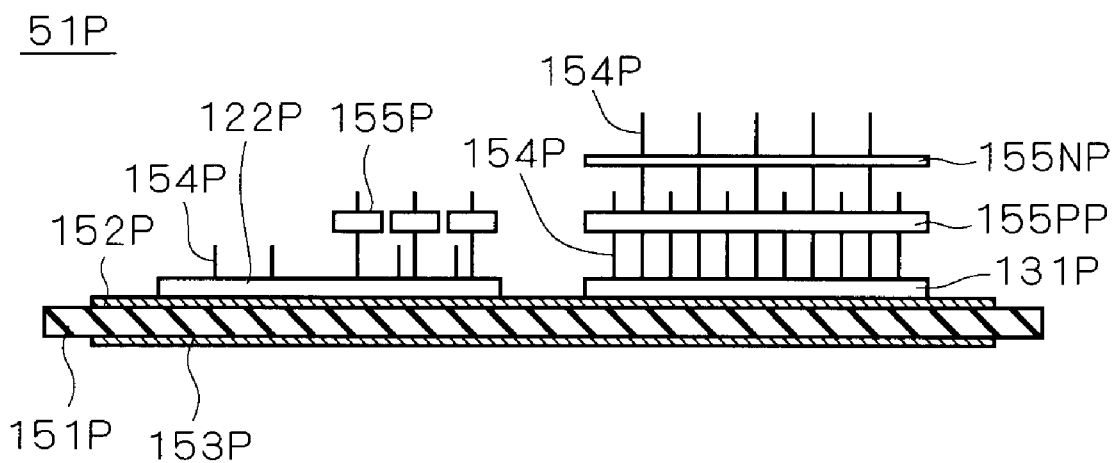
FIG. 27 is a schematic cross section illustrating the power semiconductor device in the background art.

In the power semiconductor device 51, the terminal members 111 to 113 and the power semiconductor elements (IGBTs 121 and 122 and the diodes 131 and 132) are alternately layered and joined to one another, and the external connection portions 111b to 113b of the terminal members 111 to 113 are drawn out of the package 141. Thus, the power semiconductor device 51 has no connection using the wires 154P (see FIGS. 26 and 27). Therefore, the power semiconductor device 51 can solve the problems caused by the connection using the wires 154P.

Since no disconnection is caused by a break of a wire or the like even if vibration is applied, for example, a product life can be increased. Since there is no need for providing connecting portions of the wires, the power semiconductor device 51 can be downsized. In a case of using the terminal members 111 to 113, since a contact area (in other words, a cross-sectional area of a current path) with the power semiconductor elements 121, 122, 131 and 132 can be easily enlarged as compared with the case of using the wires 154P and direct joints between the terminal members 111 to 113 and the power semiconductor elements 121, 122, 131 and 132 can considerably reduce the length of interconnection, it is possible to remarkably lower the voltage drop and wire inductance, as compared with the case of the wires 154P, to reduce the power loss.

While a manufacturing time becomes longer as the number of wires 154P (depending on the current rating) increases, the power semiconductor device 51 has a structure in which the terminal members 111 to 113 are joined to the IGBTs 121 and 122 and the diodes 131 and 132 regardless of the current rating and thereby shows outstanding productivity.

Further, the layered structure of the terminal members 111 to 113 and the IGBTs 121 and 122 and the diodes 131 and 132 ensures downsizing.

In this case, it is desirable that the first and second diodes 131 and 132 should be elements or semiconductor chips having the same structure (including, e.g., a structure for high breakdown voltage). For example, both the diodes 131 and 132 are forward mesa diodes or reverse mesa diodes. When the same type diodes are used as the diodes 131 and 132, there is no need for preparing two diodes of different types and it is therefore possible to reduce the cost. The same applies to the first and second IGBTs 121 and 122.

Since the power semiconductor device 51 has no connection using the wires 154P, there is no need for considering the difference in thermal expansion between the mold resin 141 and the wire 154P, the mutual contact of the wires 154P in molding or the like. This allows more flexible selection of the mold resin 141, and therefore reduces the cost, for example.

Since the first main surface 111S of the element arrangement portion 111a of the first terminal member 111 and the second main surface 113T of the element arrangement portion 113a of the third terminal member 113 are exposed out of the package 141, the thermal radiation can be increased. Further, by disposing a heat sink, for example, on the exposed surfaces 111S and 113T, the thermal radiation can be further increased (discussed later thereon). With increased thermal radiation, downsized IGBTs 121 and 122 and diodes 131 and 132 can be adopted (conversely, in a case of less radiation, there is a need for using a large-sized power semiconductor element to suppress heating) and consequently the power semiconductor device 51 can be downsized. Further, by connecting (joining) circuit components or the like onto the exposed surfaces 111S and 113T, it is possible to ensure downsizing, high integration and high performance (multifunction).

Figure 6:
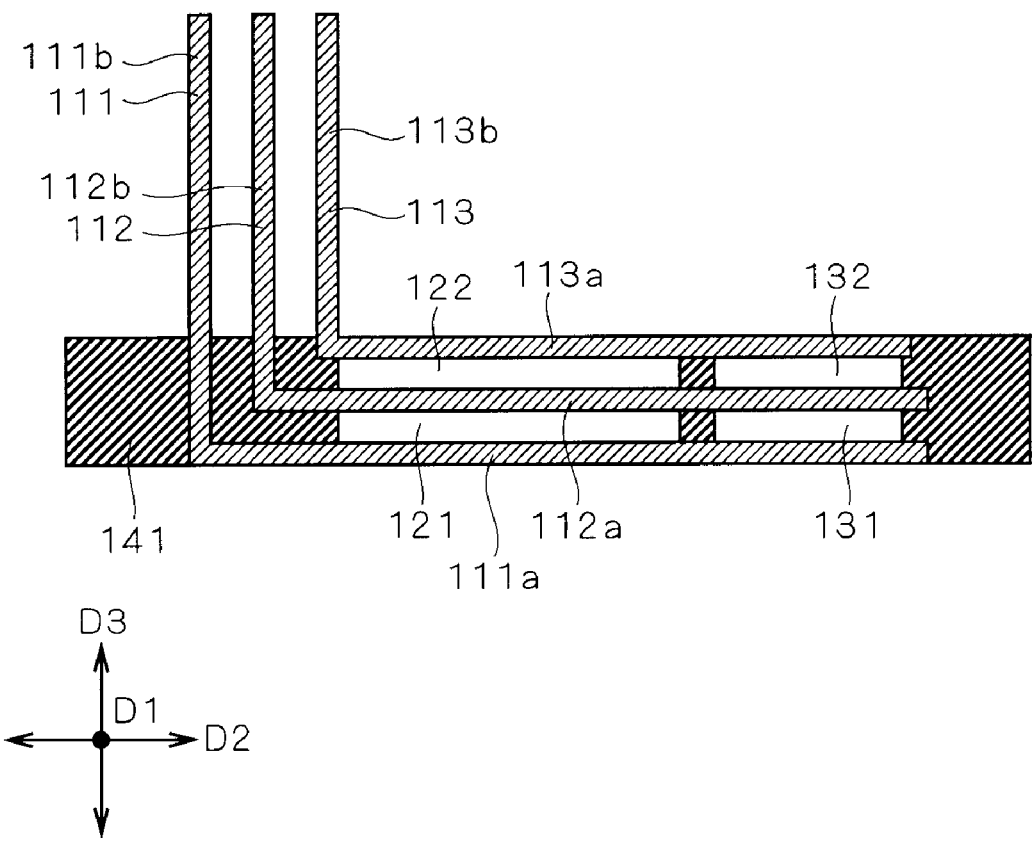
FIG. 6 is a schematic cross section taken along the line 6—6 of FIG. 5.

As a variation of the power semiconductor device 51, a second power semiconductor device 52 of the first preferred embodiment which is schematically shown in the plan view of FIG. 5 and the cross section of FIG. 6 may be adopted. FIG. 6 is a schematic cross section taken along the line 6—6 of FIG. 5. Specifically, all the three external connection portions 111b to 113b may be provided on the side of the IGBTs 121 and 122. Naturally, all the three external connection portions 111b to 113b may be provided on the side of the diodes 131 and 132. Though all the three external connection portions 111b to 113b protrude in the same direction in the power semiconductor device 52, these external connection portions may protrude in different directions like a power semiconductor device 62 of FIG. 19 as discussed later. The power semiconductor device 52 can produce the same effects.

Further, as a variation of the power semiconductor device 51, a third power semiconductor device 53 of the first preferred embodiment which is schematically shown in the cross section of FIG. 7 may be adopted. Specifically, there may be an arrangement where the IGBT 121 and the diode 131 are interchanged in the power semiconductor device 51. In other words, the first IGBT 121 is opposed to the second diode 132 in the third direction D3 with the element arrangement portion 112a of the second terminal member 112 interposed therebetween, and the first diode 131 is opposed to the second IGBT 122 in the third direction D3 with the element arrangement portion 112a interposed therebetween. Naturally, the IGBT 122 and the diode 132 may be interchanged, or such a replacement may be made in the power semiconductor device 52.

The power semiconductor device 53 produces the same effects as the power semiconductor device 51 and further produces the following effect. Specifically, since the area where the two IGBTs 121 and 122 are opposed to each other with the second terminal member 122 interposed therebetween can be reduced or these IGBTs are not layered with the second terminal member 122 interposed therebetween, it is possible to reduce or eliminate thermal interference between these IGBTs 121 and 122. Therefore, it is possible to suppress heating of the IGBTs 121 and 122 and accordingly suppress heating of the power semiconductor device 53.

The Second Preferred Embodiment

Figure 8:
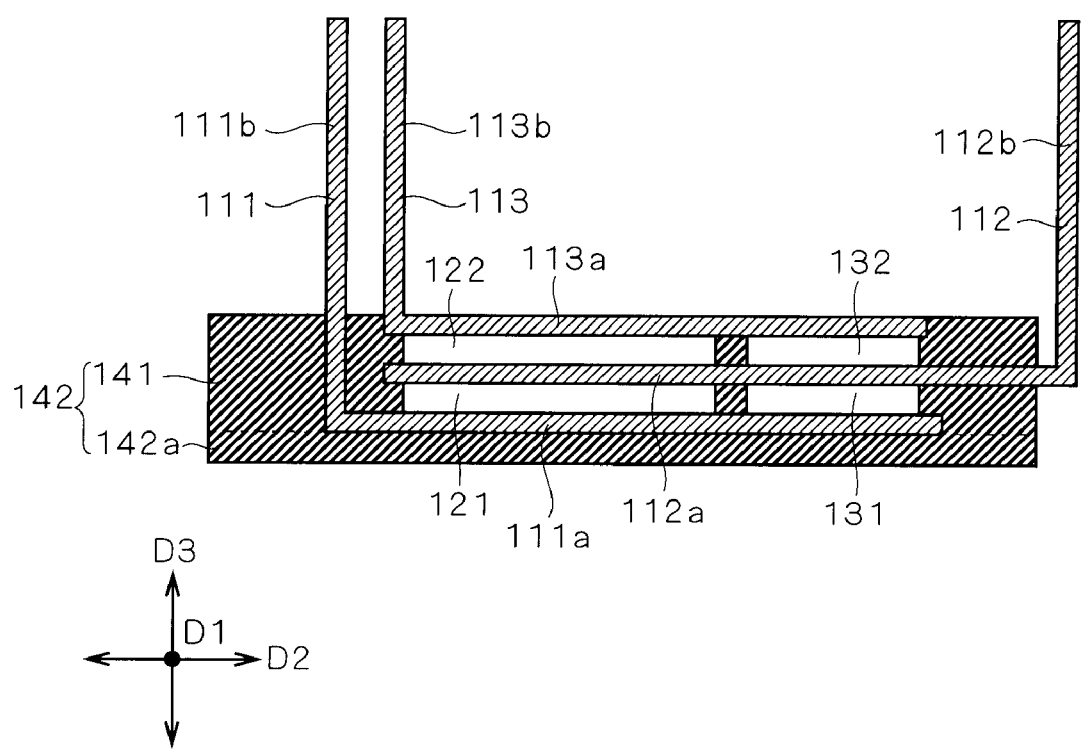
FIG. 8 is a schematic cross section illustrating a first power semiconductor device in accordance with a second preferred embodiment.

FIG. 8 is a schematic cross section illustrating a basic structure of a first power semiconductor device 54 in accordance with the second preferred embodiment. As can be seen from comparison between FIGS. 3 and 8, the power semiconductor device 54 has a structure in which the transfer mold package 141 is replaced by a transfer mold package 142 in the power semiconductor device 51.

In more detail, the transfer mold package 142 is so formed as to cover the first main surface 111S of the element arrangement portion 111a of the first terminal member 111 while making the second main surface 113T of the element arrangement portion 113a of the third terminal member 113 exposed. In this case, the transfer mold package 142 is broadly divided into the earlier-discussed transfer mold package 141 and a further insulating portion 142a. The insulating portion 142a is opposed to the IGBT 121 and the diode 131 with the element arrangement portion 111a of the first terminal member 111 interposed therebetween, being in contact with the first main surface 111S of the element arrangement portion 111a and the transfer mold package 141.

Figure 9:
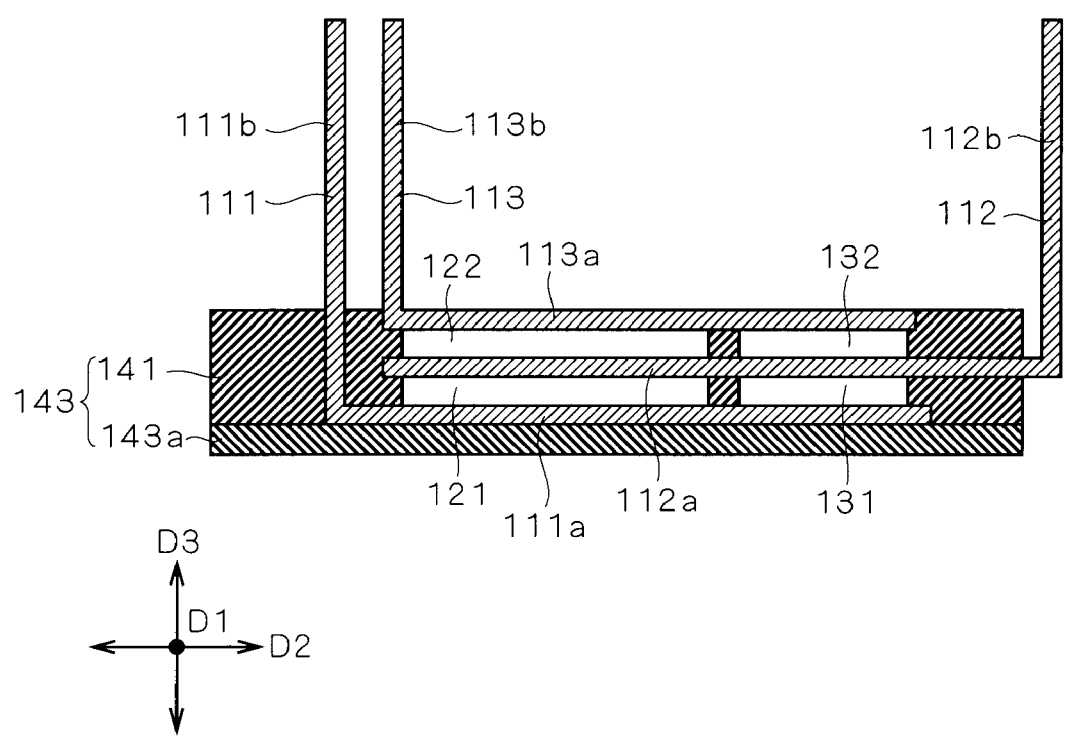
FIG. 9 is a schematic cross section illustrating a second power semiconductor device in accordance with the second preferred embodiment.

Alternatively, instead of the insulating portion 142a, an insulating film 143a may be attached to the transfer mold package 141 like in a second power semiconductor device 55 of the second preferred embodiment shown in the schematic cross section of FIG. 9. Specifically, the package 143 consists of the earlier-discussed transfer mold package 141 and the insulating film 143a which is disposed like the above insulating portion 142a.

Further, instead of the above insulating portion 142a, an insulating substrate (or insulating portion) 151 made of, e.g., ceramic may be used like in a third power semiconductor device 56 of the second preferred embodiment shown in the schematic cross section of FIG. 10. Specifically, the power semiconductor device 56 has a structure in which the insulating substrate 151 with metal layers 152 and 153 is additionally provided in the power semiconductor device 51.

In more detail, the metal layers 152 and 153 made of, e.g., copper or aluminum (having thickness of, e.g., about 0.3 to 0.5 mm) are disposed on upper and lower main surfaces of the insulating substrate 151. If the insulating substrate 151 is ceramic, the metal layers 152 and 153 are joined thereto with, e.g., brazing silver (silver for braze). The metal layer 152 is joined onto the first main surface 111S of the element arrangement portion 111a of the first terminal member 111. In this case, the insulating substrate 151 is opposed to the IGBT 121 and the diode 131 with the element arrangement portion 111a of the first terminal member 111 interposed therebetween.

A transfer mold package 144 of the power semiconductor device 56 has a structure in which the transfer mold package 141 further extends towards the insulating substrate 151, and is so formed as to fix the insulating substrate 151 to the terminal members 111 to 113.

The insulating portion 142a, the insulating film 143a and insulating substrate 151 may be provided on the side of the third terminal member 113 (see a transfer mold package 145 of FIG. 19 as discussed later), or may be provided on both sides of the first and third terminal members 111 and 113 (see a transfer mold package 146 of FIG. 21 as discussed later). The insulating portion 142a or the like may be applied to the earlier-discussed power semiconductor devices 52 and 53.

Since the insulating portion 142a, the insulating film 143a and the insulating substrate 151 can insulate the element arrangement portion 111a of the first terminal member 111 and/or the element arrangement portion 113a of the third terminal member 113 from the outside, the power semiconductor devices 54 to 56 allow more flexible selection of their installation location as compared with the earlier-discussed power semiconductor device 51 or the like (see the fifth preferred embodiment discussed later).

Further, by forming the insulating substrate 151 of a material of excellent thermal conductivity such as ceramic, the insulating substrate 151 may be used as a radiator plate. Specifically, the power semiconductor device 56 having the above insulating substrate 151 can increases thermal radiation as compared with the power semiconductor devices 54 and 55 having the insulating portion 142a and the insulating film 143a as part of the transfer mold package 142.

As a variation of the power semiconductor device 56, a fourth power semiconductor device 57 of the second preferred embodiment which is schematically shown in the cross section of FIG. 11 may be adopted. Specifically, the metal layer 152, which is in contact with the element arrangement portion 111a in the above power semiconductor device 56, is used as the element arrangement portion in the power semiconductor device 57. In other words, a first terminal member 110 of the power semiconductor device 57 is constituted of an element arrangement portion formed of the metal layer 152 (hereinafter, also referred to as "element arrangement portion 152") and the external connection portion 111b, and the external connection portion 111b is joined onto the metal layer 152 with solder or the like to stand on the insulating substrate 151. In this case, the metal layer 152 is formed to have a thickness of, e.g., 0.3 to 0.5 mm and patterned like the element arrangement portion 111a of the first terminal member 111. Further, in the power semiconductor device 57, the insulating substrate 151 is in contact with the first terminal member 110. It goes without saying that this first terminal member 110 can be applied the power semiconductor devices 52 and 53 of the first preferred embodiment.

The Third Preferred Embodiment

FIG. 12 is a schematic cross section illustrating a basic structure of a first power semiconductor device 58 in accordance with the third preferred embodiment. FIGS. 13 and 14 are schematic cross sections of the power semiconductor device 58 as viewed from the direction of the arrows 13 and 14 of FIG. 12, respectively.

The power semiconductor device 58 includes one arm of the power semiconductor device 50 and control circuits 160 and 170 for this arm shown in the block diagram of FIG. 1, and has a structure in which the insulating substrate 151 with the metal layers 152 and 153 in the power semiconductor device 57 of FIG. 11 extends and the control circuits 160 and 170 are layered on the extension in the third direction D3.

The power semiconductor device 58 shows a case where the external connection portion 111b of the first terminal member 110 stands a little away from an edge of the metal layer 152. For simple illustration, FIG. 12 does not show the insulating substrate 151.

In the power semiconductor device 58, an insulating substrate 161 made of, e.g., ceramic or glass epoxy is disposed on the element arrangement portion 152 of the first terminal member 110, as well as the IGBT 121 and the diode 131.

On the insulating substrate 161, a circuit pattern 162 is formed on the side opposed to the element arrangement portion 152 with the insulating substrate 161 interposed therebetween. In this case, if the insulating substrate 161 is ceramic, the circuit pattern 162 is formed of, e.g., brazing silver (used for joining the metal layers 152 and 153 onto the insulating substrate 151 made of ceramic as discussed early), and if the insulating substrate 161 is glass epoxy, the circuit pattern 162 is formed of, e.g., copper.

In order to form the circuit pattern 162, a layer of brazing silver, for example, is entirely formed on the insulating substrate 161 and then an etching is performed to form a predetermined pattern.

Further, an IC chip 163 for control circuit is mounted on the insulating substrate 161 and joined to the circuit pattern 162 with, e.g., solder. Though not shown for simple illustration, elements and further circuit patterns 162 connected to the elements are disposed on the insulating substrate 161. In other words, the IC chip 163 for control circuit, circuit components including the not-shown elements and the circuit patterns 162 constitute the control circuit 160.

The circuit pattern 162 is electrically connected to the gate or a control electrode 121G of the IGBT 121 through a relay terminal 165 made of, e.g., a metal piece. Though FIG. 13 schematically shows a case where the control electrode 121G is provided on the second main surface 121T of the IGBT 121 (see FIG. 4), if the control electrode 121G is provided on the first main surface 121S (see FIG. 4), some consideration is needed on, e.g., the shape of the relay terminal 165. Alternatively, there may be a case, for example, where the metal layer 152 is patterned to provide positions to which the electrodes 121E and 121G are joined, being out of contact with each other, and the relay terminal 165 is joined to a position for the control electrode. 121G.

One end of a control circuit terminal 164 is joined to the circuit pattern 162 by soldering or welding, and the other end of the control circuit terminal 164 protrudes out of the transfer mold package 144.

An insulating layer 169 made of, e.g., glass epoxy is disposed on the insulating substrate 161, covering the IC chip 163 and the circuit pattern 162, and an insulating substrate 171 is so disposed on the insulating layer 169 as to face the insulating substrate 161 with the insulating layer 169 interposed therebetween.

A circuit pattern 172 forming the control circuit 170 and an IC chip 173 for the control circuit are disposed on a main surface (opposite to a main surface which is in contact with the above insulating layer 169) of the insulating substrate 171 like the circuit pattern 162 and the IC chip 163, and the circuit pattern 172 is connected to the control electrode 122G of the IGBT 122 through a relay terminal 175. A control circuit terminal 174 is disposed like the above control circuit terminal 164 and joined to the circuit pattern 172. The positional relation of the control electrode 122G of the IGBT 122 and the circuit pattern 172 in the third direction D3 is controlled by controlling the thickness of the insulating layer 169 (the size in the third direction D3), to ensure the connection with the relay terminal 175.

The control circuits 160, 170 or the like are housed in the transfer mold package 144.

The high-performance power semiconductor device (IPM (Intelligent Power Module)) 58 with the control circuits 160 and 170 as well as the power semiconductor elements 121, 122, 131 and 132 also produces the earlier-discussed effects.

In particular, since the circuit patterns 162 and 172 can be formed thinly (e.g., 0.1 mm or less) by using the brazing silver, it is possible to reduce deviation of the circuit components such as the IC chips 163 and 173 in assembling the control circuits 160 and 170. The reason for this is as follows. If the circuit patterns 162 and 172 are thick or high, even when the circuit components are slightly displaced, the circuit components drop from the circuit patterns 162 and 172, to easily cause a significant deviation. In contrast to this, the thin circuit patterns 162 and 172 using the brazing silver do not easily cause such a significant deviation. Further, the thin circuit patterns 162 and 172 can reduce a manufacturing failure such as a solder bridge.

Further, since the thin circuit patterns 162 and 172 allow a fine patterning (with pattern width of, e.g., 0.1 mm or less), it is possible to increase integration of the control circuits 160 and 170.

Figure 15:
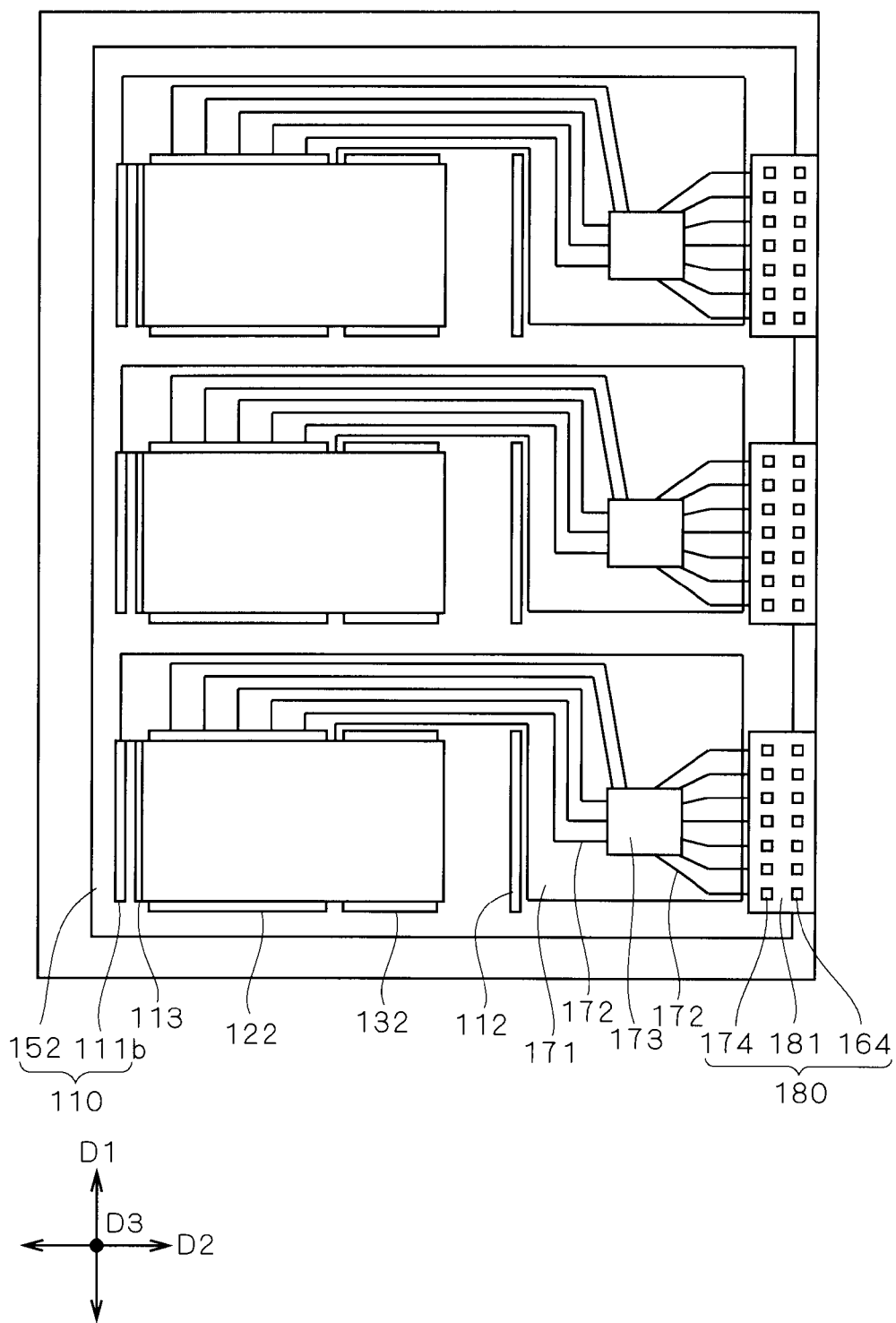
FIG. 15 is a schematic plan view illustrating a second power semiconductor device in accordance with the third preferred embodiment.

FIG. 15 is a schematic plan view illustrating a second power semiconductor device 59 in accordance with the third preferred embodiment. The power semiconductor device 59 corresponds to the power semiconductor device 50 shown in the block diagram of FIG. 1, in detail includes three arms and the control circuits 160 and 170 for the arms.

Figure 13:
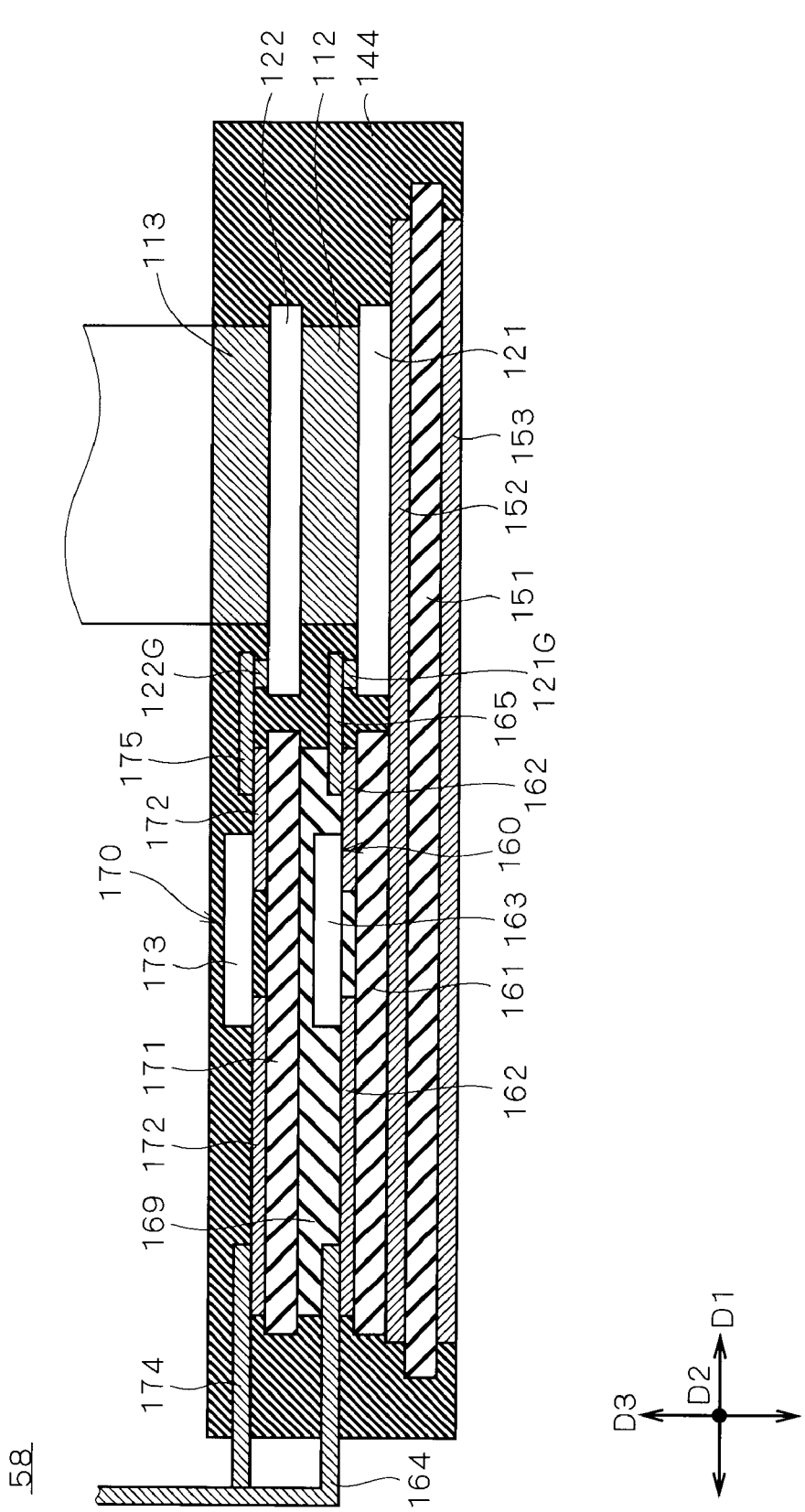
FIG. 13 is a schematic cross section of the first power semiconductor device in accordance with the third preferred embodiment as viewed from the direction of an arrow 13 of FIG. 12.

In more detail, the power semiconductor device 59 basically includes three power semiconductor devices 58 shown in FIGS. 12 to 14, having a structure in which the insulating substrates 151 (see FIG. 13) with the metal layers 152 and 153 of the three power semiconductor devices 58 are united. In other words, the three power semiconductor devices 58 share a single insulating substrate 151 with the metal layers 152 and 153, and accordingly share the element arrangement portion 152 of the first terminal member 110.

Further, the power semiconductor device 59 has an insulating member 181 made of, e.g., resin for each power semiconductor device 58, i.e., each arm. The insulating member 181 collectively holds a plurality of control circuit terminals 164 and 174 so that the control circuit terminals 164 and 174 should not be in mutual contact. More specifically, the insulating member 181 and the control circuit terminals 164 and 174 constitute a multi-terminal connector structure or a connector 180. As shown in the cross section of FIG. 16, the insulating member 181 is fixed to the element arrangement portion 152 of the first terminal member 110 by, e.g., adhesion and supported thereby.

In this case, the insulating member 181 can be formed by applying liquid or paste-like resin to the terminals 164 and 174 which are already connected to the circuit patterns 162 and 172 and hardening the resin. Alternatively, a commercially-available connector may be used as the connector 180 having the terminals 164 and 174. Further, unlike the case of FIG. 15, a single insulating member 181 may be provided for the three power semiconductor devices 58, i.e., the three arms.

Since the insulating member 181 of the connector 180 is fixed on the element arrangement portion 152 of the first terminal member 110 as discussed above, the terminals 164 and 174 are fixed on the first terminal member 110. It is thereby possible to provide stronger terminals 164 and 174 against vibration or external force, as compared with no provision of insulating member 181. This allows reduction of problems such as a break of the terminals 164 and 174.

Like in the power semiconductor devices 58 and 59, the control circuits 160 and 170 and the connector 180 may be provided in the earlier-discussed power semiconductor devices 51 to 56.

The Fourth Preferred Embodiment

FIG. 17 is a schematic cross section illustrating a basic structure of a first power semiconductor device 60 in accordance with the fourth preferred embodiment. The power semiconductor device 60 basically includes the earlier-discussed power semiconductor device 51 (see FIG. 3) and heat sinks 191 and 192.

In more detail, the power semiconductor device 60 includes the first terminal member 111 of the earlier-discussed power semiconductor device 51 which is not bent. In other words, the first terminal member 111 of the power semiconductor device 60 has a plate-like shape and in the first main surface 111S of the first terminal member 111 (see FIG. 4), the element arrangement portion 111a is continuous with the external connection portion 111b without any step. The same applies to the second main surface 111T of the first terminal member 111.

The heat sink 191 is disposed, being in entire contact with the first main surface 111S of the first terminal member 111. The external connection portion 111b of the first terminal member 111 is provided with an external-thread insertion hole 111c and the first terminal member 111 is fixed to the heat sink 191 with an external thread (or bolt) 116c inserted into the external-thread insertion hole 111c. Though tapping may not be made in the external-thread insertion hole 111c and external-thread insertion holes 112c and 113c discussed later, tapping allows stronger fixing. The first terminal member 111 may be fixed to the heat sink 191 by soldering, ultrasonic bonding, brazing, welding, bonding with adhesive or the like, additionally to or instead of the external thread.

Further, on the second main surface 113T of the element arrangement portion 113a of the third terminal member 113 (see FIG. 4), the fin-like heat sink 192 is joined by soldering, ultrasonic bonding, brazing, welding, bonding with adhesive or the like.

Unlike the case of FIG. 17, instead of the fin-like heat sink 192, a block-like heat sink may be joined or the heat sink 191 is replaced by a fin-line heat sink.

In the power semiconductor device 60, though the heat sinks 191 and 192 may be conductive (electrically conductive) or not, if the conductive heat sinks 191 and 192 made of, e.g., copper are used, the heat sinks 191 and 192 can be used as part of a circuit or an interconnection (see the sixth preferred embodiment discussed later).

The external connection portions 112b and 113b of the second third terminal members 112 and 113 are provided with external-thread insertion holes 112c and 113c and the second and third terminal members 112 and 113 are fixed to terminals 512 and 513 of other devices with external threads 117c and 118c inserted into the external-thread insertion holes 112c and 113c, respectively. In this case, by tapping the external-thread insertion holes 112c and 113c, fixing can be made without any additional nut (the external-thread insertion holes 112c and 113c serve as nuts). In the background-art power semiconductor device, connection with other devices is established with connectors.

The plate-like first terminal member 111, entirely using the first main surface 111S, allows provision of the heat sink 191 which is larger than that provided on the first terminal member 111 bent in an L-shape (see FIG. 3).

Figure 18:
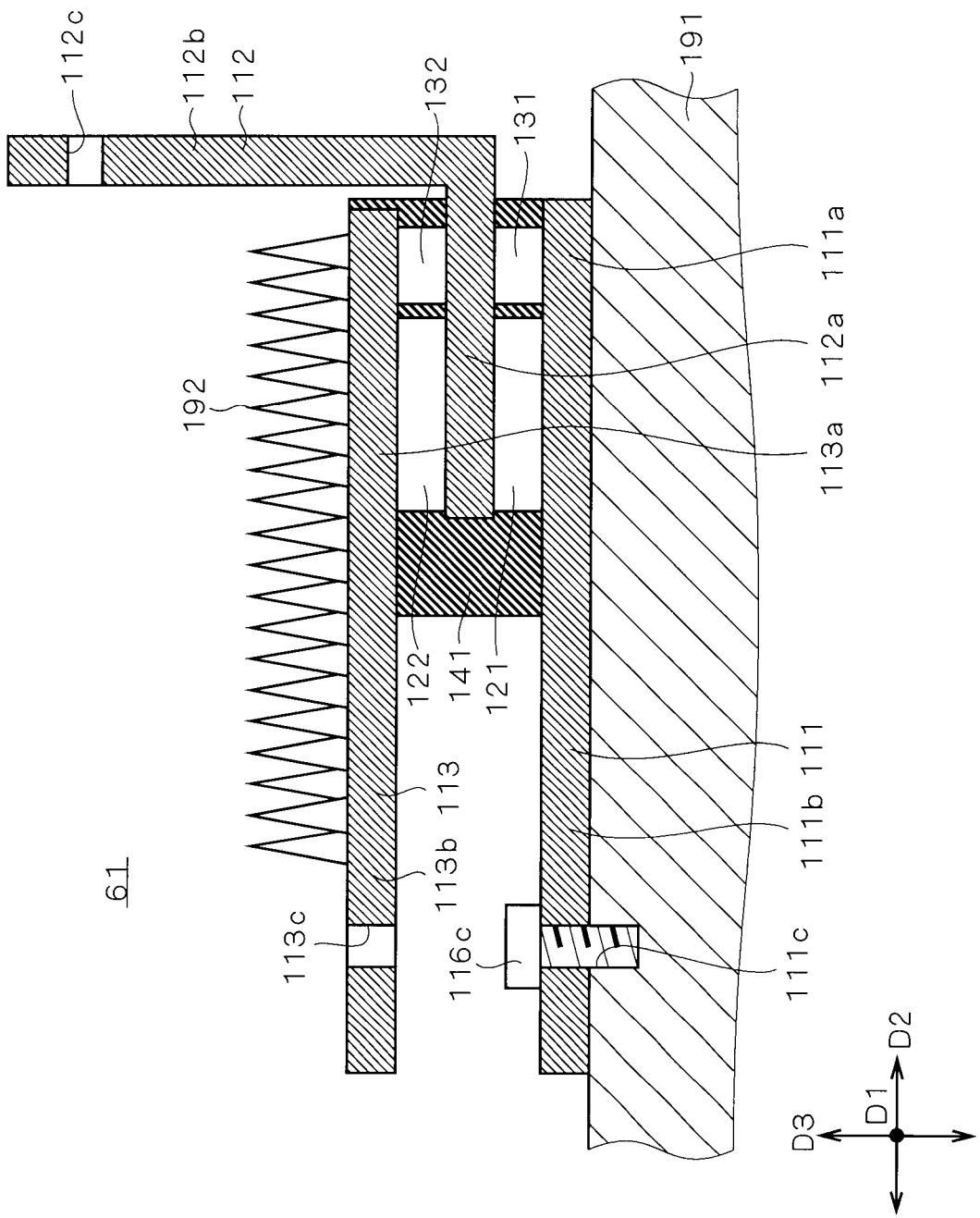
FIG. 18 is a schematic cross section illustrating a second power semiconductor device in accordance with the fourth preferred embodiment.

In consideration of this point, as a variation of the power semiconductor device 60, a second power semiconductor device 61 of the fourth preferred embodiment schematically shown in the cross section of FIG. 18 may be adopted. Specifically, a plate-like member is also used as the third terminal member 113 in the power semiconductor device 61. In the second main surface 113T of the third terminal member 113 (see FIG. 4), the element arrangement portion 113a is continuous with the external connection portion 113b without any step. The same applies to the first main surface 113S of the third terminal member 113. This allows the heat sink 192 to be disposed not only on the element arrangement portion 113a but also on the external connection portion 113b. In other words, the heat sink 192 which is larger than that of the power semiconductor device 60 of FIG. 17 can be used.

In the background-art power semiconductor device, the external-thread insertion hole for fixing the heat sink is provided inside a case. In contrast to this, the heat sink 191 is fixed by using the external-thread insertion hole 111c of the first terminal member 111 in the power semiconductor devices 60 and 61. This allows downsizing of the package 141 and reduction in cost for the materials.

Further, it is possible to apply the shape of the terminal members and the arrangement of the heat sinks of the fourth preferred embodiment to the power semiconductor device 52 and the like.

The Fifth Preferred Embodiment

As discussed in the second preferred embodiment, by insulating, e.g., the element arrangement portion 111a of the first terminal member 111 from outside with the insulating portion 142a and the like, the power semiconductor devices 54 to 57 allow more flexible selection of their installation location. In the fifth preferred embodiment, a power semiconductor device designed with attention paid to this point will be discussed.

Figure 19:
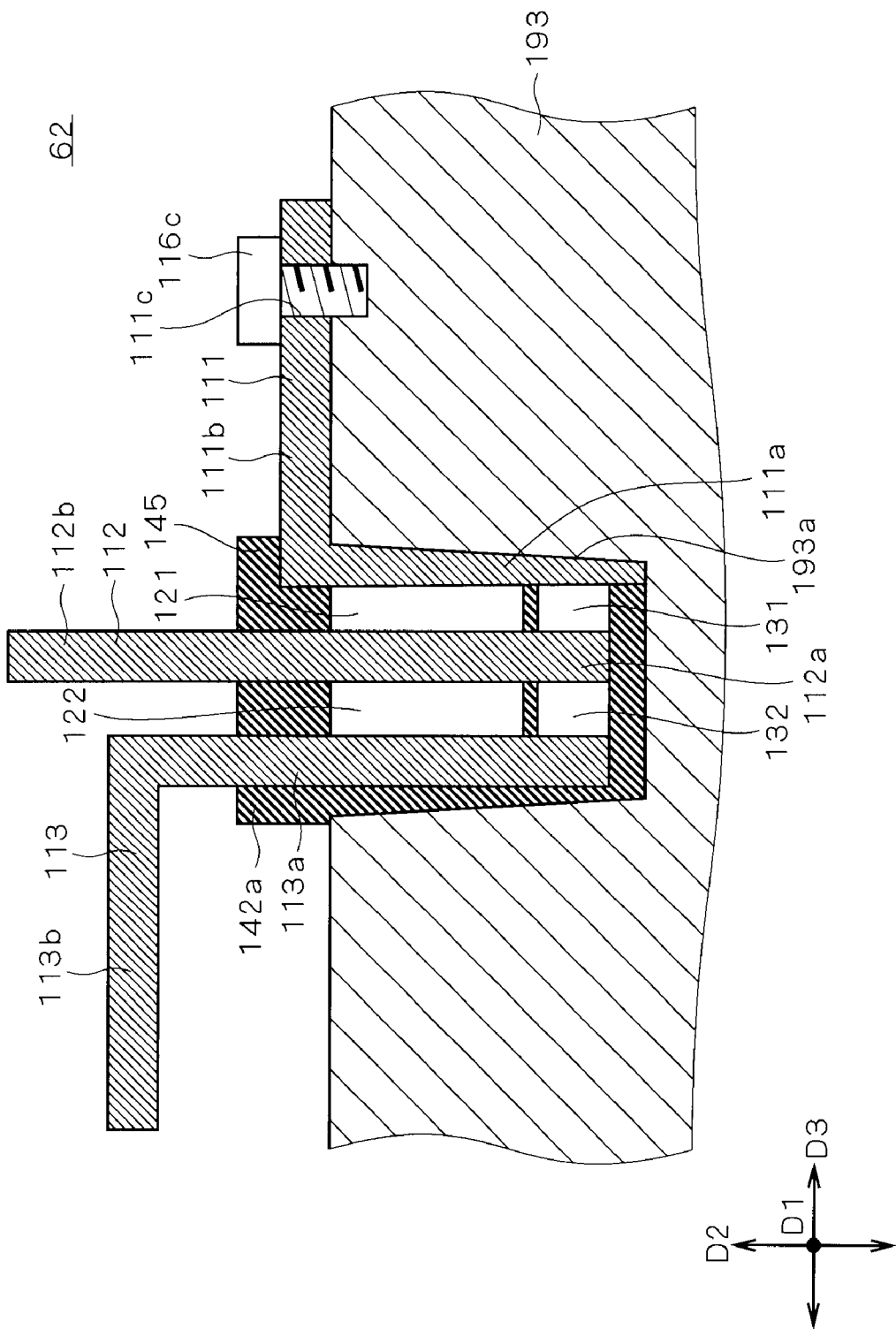
FIG. 19 is a schematic cross section illustrating a first power semiconductor device in accordance with a fifth preferred embodiment.

FIG. 19 is a schematic cross section illustrating a basic structure of a first power semiconductor device 62 in accordance with the fifth preferred embodiment. The power semiconductor device 62 basically includes a variation of the earlier-discussed power semiconductor device 54 (see FIG. 8) as a base component and further includes a conductive heat sink 193 having a recess 193a in which the base component is inserted.

In more detail, the power semiconductor device 62 has a structure, as a base component, in which the external connection portions 111b to 113b of the first to third terminal members 111 to 113 in the power semiconductor device 54 of FIG. 8 are disposed on the same side like in the power semiconductor device 52 of FIG. 6. In the power semiconductor device 62, the second terminal member 112 has a plate-like shape and the first and third terminal members 111 and 113 have substantial L-shapes being bent towards opposite sides. The second and third terminal members 112 and 113 are so disposed outside the recess 193a as not to be in contact with the heat sink 193.

A transfer mold package 145 in the power semiconductor device 62 is basically the same as the transfer mold package 142 of FIG. 8, but the insulating portion 142a is so provided as to be in contact with the second main surface 113T of the element arrangement portion 113a of the third terminal member 113 (see FIG. 4). The first main surface 111S of the element arrangement portion 111a of the first terminal member 111 (see FIG. 4) is exposed out of the transfer mold package 145.

The base component is inserted into the recess 193a of the heat sink 193 with the external connection portions 111b, 112b and 113b of the terminal members 111, 112 and 113 protruded out of the recess 193a, being in contact with the heat sink 193 in the recess 193a. Conversely, the recess 193a has such a size as to house the base component in the above condition. In this case, the recess 193a has such a depth as to house the whole of power semiconductor elements, i.e., the IGBTs 121 and 122 and the diodes 131 and 132.

The insulating portion 142a of the transfer mold package 145 is in contact with the heat sink 193 inside the recess 193a. Since the insulating portion 142a covers the element arrangement portion 113a of the third terminal member 113, the third terminal member 113 is insulated from the conductive heat sink 193 inside the recess 193a.

The first main surface 111S of the element arrangement portion 111a of the first terminal member 111 (see FIG. 4) is exposed inside the recess 193a, being in contact with the conductive heat sink 193 inside the recess 193a. The first main surface 111S of the external connection portion 111b of the first terminal member 111 is in contact with the heat sink 193 outside the recess 193a. More specifically, the first terminal member 111 is bent in an L-shape so that the whole first main surface 111S thereof may be in contact with the heat sink 193. In this case, the first terminal member 111 is connected to the heat sink 193 in an equipotential manner. The base component is fixed to the heat sink 193 with the external-thread insertion hole 111c of the first terminal member 111.

The recess 193a has a tapered shape which becomes narrower as closer to its bottom, and the base component is also formed in a tapered shape correspondingly to the tapered shape of the recess 193a. Specifically, the shapes of the transfer mold package 145 and the first terminal member 111 are designed so that the cross-sectional area of the base component becomes smaller towards the ends of the element arrangement portions 111a, 112a and 113a (on the sides farther away from the external connection portions 111b, 112b and 113b). This tapered shape allows easy insertion of the base component into the recess 193a.

In the power semiconductor device 62, the diodes 131 and 132 are disposed on a bottom side of the recess 193a in the heat sink 193 and the IGBTs 121 and 122 are disposed on an opening side thereof.

In the power semiconductor device 62, the IGBTs 121 and 122 and the diodes 131 and 132 are surrounded by the heat sink 193. Specifically, the respective side surfaces of the IGBTs 121 and 122 and the diodes 131 and 132 are also opposed to the heat sink 193 in the power semiconductor device 62 while the different heat sinks 191 and 192 are provided on the first and third terminal members 111 and 113, respectively, in the earlier-discussed power semiconductor devices 60 and 61 of FIGS. 17 and 18. Since the number of surfaces of the IGBTs 121 and 122 and the diodes 131 and 132 which are opposed to the heat sink 193 is larger than that in the power semiconductor devices 60 and 61 of FIGS. 17 and 18, the thermal radiation increases. In this case, the power semiconductor device 62 with the smaller heat sink 193 has the same thermal radiation characteristic as the power semiconductor devices 60 and 61 of FIGS. 17 and 18. Since the downsized power semiconductor elements 121, 122, 131 and 132 can be adopted because of increase in thermal radiation, the power semiconductor device 62 can be downsized.

The recess 193a can be easily formed by digging the heat sink 193. Alternatively, the recess 193a can be formed by assembling a plurality of heat sinks. In these cases, forming the recess 193a by digging simplifies the structure and manufacture of the power semiconductor device 62 as well as those of the heat sink 193.

The arrangement positions of the IGBTs 121 and 122 and the diodes 131 and 132 may be interchanged. Specifically, like a second power semiconductor device 63 of the fifth preferred embodiment schematically shown in the cross section of FIG. 20, the IGBTs 121 and 122 are disposed on bottom the side of the recess 193a of the heat sink 193 and the diodes 131 and 132 are disposed on the opening side thereof.

In this power semiconductor device 63, since the IGBTs 121 and 122 are opposed to the bottom of the recess 193a of the heat sink 193, the area of the IGBTs 121 and 122 which is opposed to the heat sink 193 is larger that of the diodes 131 and 132. Since the IGBTs 121 and 122 generally have high calorific value than the diodes 131 and 132, it is possible to achieve good thermal radiation in the power semiconductor device 63 on the whole. Further, forming only one of the IGBTs 121 and 122 is disposed on the bottom side of the recess 193a (see the power semiconductor device 53 of FIG. 7) can produce this effect to some degrees.

Figure 21:
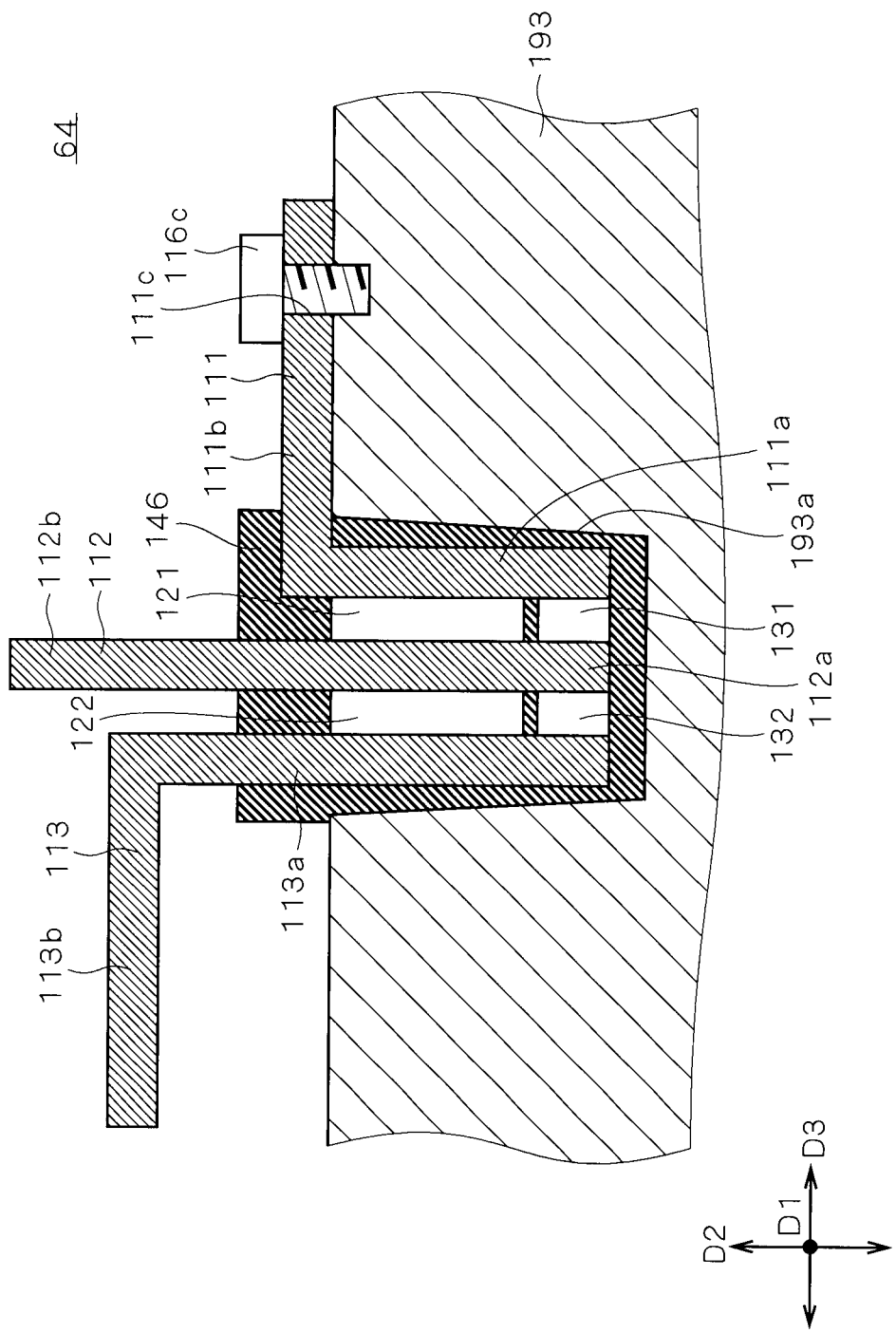
FIG. 21 is a schematic cross section illustrating a third power semiconductor device in accordance with the fifth preferred embodiment.

As a variation of the power semiconductor device 62, a third power semiconductor device 64 of the fifth preferred embodiment which is schematically shown in the cross section of FIG. 21 may be adopted. Specifically, in the power semiconductor device 64, both the first main surface 111S of the element arrangement portion 111a of the first terminal member 111 and the second main surface 113T of the element arrangement portion 113a of the third terminal member 113 are covered with a transfer mold package 146 and the element arrangement portions 111a and 113a of the first and third terminal members 111 and 113 are not in contact with the heat sink 193 inside the recess 193a. The transfer mold package 146 of the power semiconductor device 64 is formed in a tapered shape.

Also in the power semiconductor device 64, since the IGBTs 121 and 122 and the diodes 131 and 132 are surrounded by the heat sink 193, the thermal radiation increases like in the power semiconductor device 62 and the heat sink 193 can be downsized.

Since the first terminal member 111 is exposed inside the recess 193a of the heat sink 193 in the power semiconductor devices 62 and 63, the power semiconductor devices 62 and 63 can increase the thermal radiation as compared with the power semiconductor device 64 in which a mold resin is present between the first terminal member 111 and the heat sink 193. The same applies to the case where the third terminal member 113 is exposed.

Figure 22:
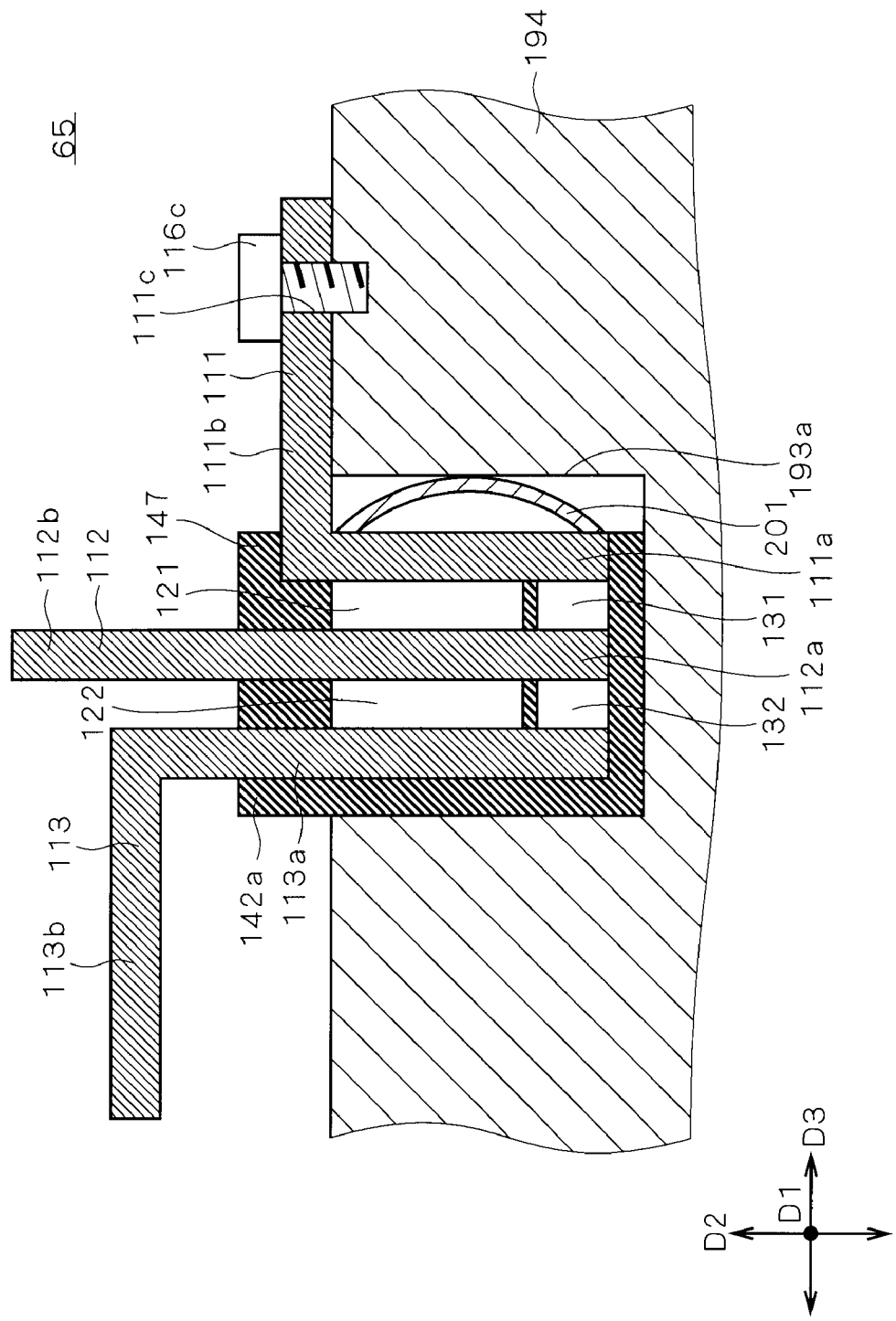
FIG. 22 is a schematic cross section illustrating a fourth power semiconductor device in accordance with the fifth preferred embodiment.

As a variation of the power semiconductor device 62, a fourth power semiconductor device 65 of the fifth preferred embodiment which is schematically shown in the cross section of FIG. 22 may be adopted. Specifically, in the power semiconductor device 65, a conductive heat sink 194 has a recess 194a having a larger opening than the above recess 193a, and a leaf spring 201 is provided in a clearance between the recess. 194a and the base component. Since the recess 194a has a larger opening than the earlier-discussed recess 193a, FIG. 22 shows a case where the recess 194a and the base component are not tapered.

The leaf spring 201 is in contact with the element arrangement portion 111a of the first terminal member 111 and the heat sink 194 (a side surface of the recess 194a) inside the recess 194a and the elasticity of the leaf spring 201 works to press the base component, more specifically a transfer mold package 147 on the third terminal member 113, against the heat sink 194. The base component can be thereby fixed to the heat sink 194. The leaf spring 201 may be only inserted in the clearance in the recess 194a, or may be joined to the first main surface 111S (see FIG. 4) of the element arrangement portion 111a of the first terminal member 111 by, e.g., soldering or welding. If the leaf spring 201 is joined to the first terminal member 111 in advance, the base component can be easily inserted into the recess 194a in the manufacturing process of the power semiconductor device 65.

In this case, using the leaf spring 201 made of a conductive material such as metal allows the heat sink 194 to be in contact with the first terminal member 111 in an equipotential manner through the leaf spring 201. In contrast to this, if the first terminal member 111 is in contact with the heat sink 194 outside the recess 194a, an insulative leaf spring 201 may be used.

In either case, using the leaf spring 201 made of a material having thermal conductivity higher than that of air (such as metal) allows efficient transfer of heat of the IGBTs 121 and 122 and the diodes 131 and 132 to the heat sink 194 and consequently increases the thermal radiation, as compared with a case without the leaf spring 201.

In this case, even if the leaf spring 201 is provided on the side of the third terminal member 113, the above action and effect of fixing the elements and improving the thermal radiation can be achieved. Therefore, combination the leaf spring 201 and the base like the power semiconductor device 64 of FIG. 21, in which both the first and third terminal members 111 and 113 are covered with the transfer mold package 146, also produces the same effect.

It goes without saying that a variety of elastic bodies such as washer spring may be adopted, instead of the leaf spring 201.

Figure 20:
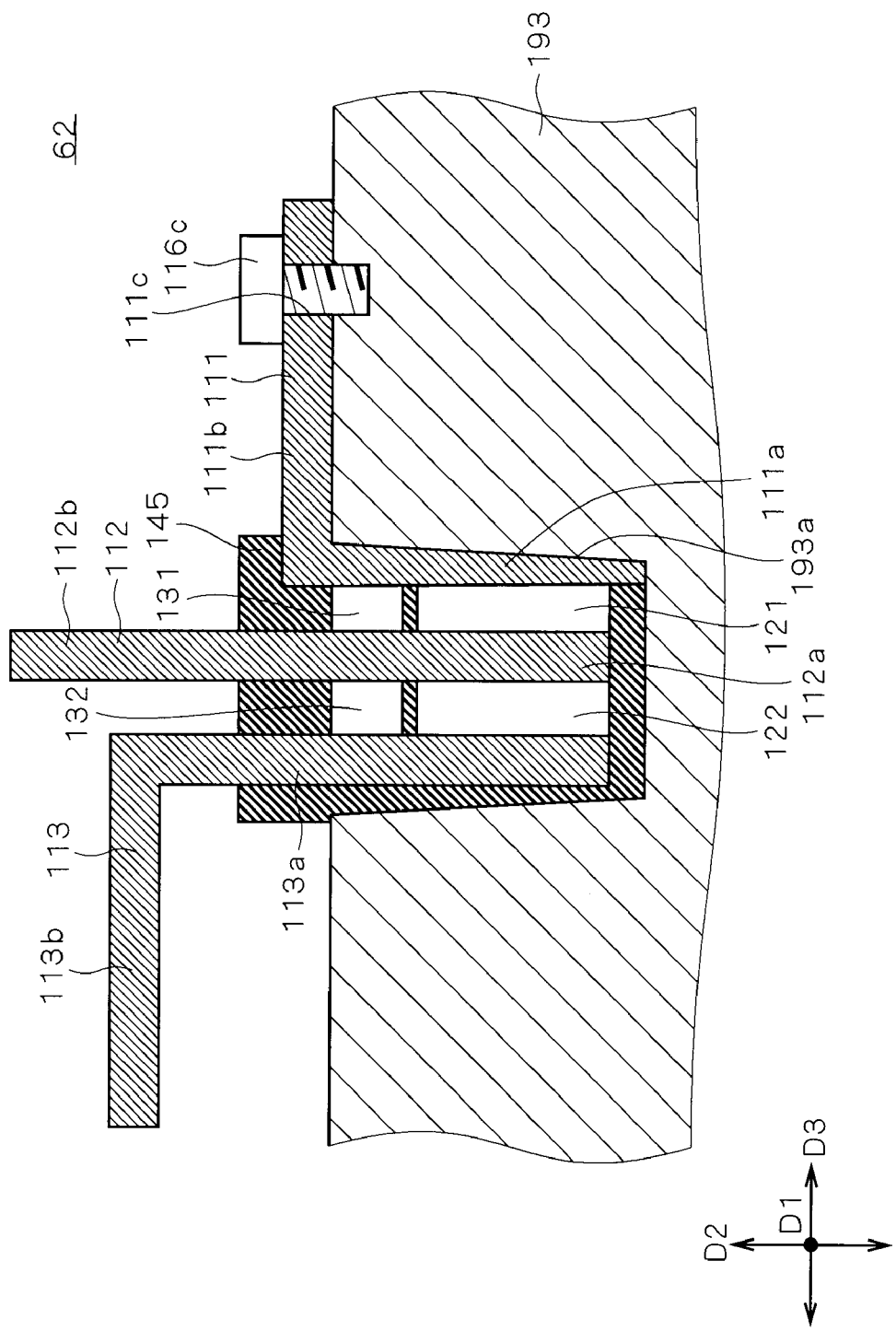
FIG. 20 is a schematic cross section illustrating a second power semiconductor device in accordance with the fifth preferred embodiment.

In the power semiconductor devices 64 and 65, the arrangement positions of the IGBTs 121 and 122 and the diodes 131 and 132 may be interchanged like in the power semiconductor device 63 of FIG. 20.

Further, the first terminal member 111 and/or the third terminal member 113 may be insulated from the heat sink 194 by the earlier-discussed insulating film 143a of FIG. 9 and the insulating substrate 151 of FIG. 10. Furthermore, the control circuits 160 and 170 may be mounted on the power semiconductor devices 62 to 65 like the power semiconductor device 58 of FIG. 12 and the power semiconductor device 59 of FIG. 15.

The Sixth Preferred Embodiment

Figure 23:
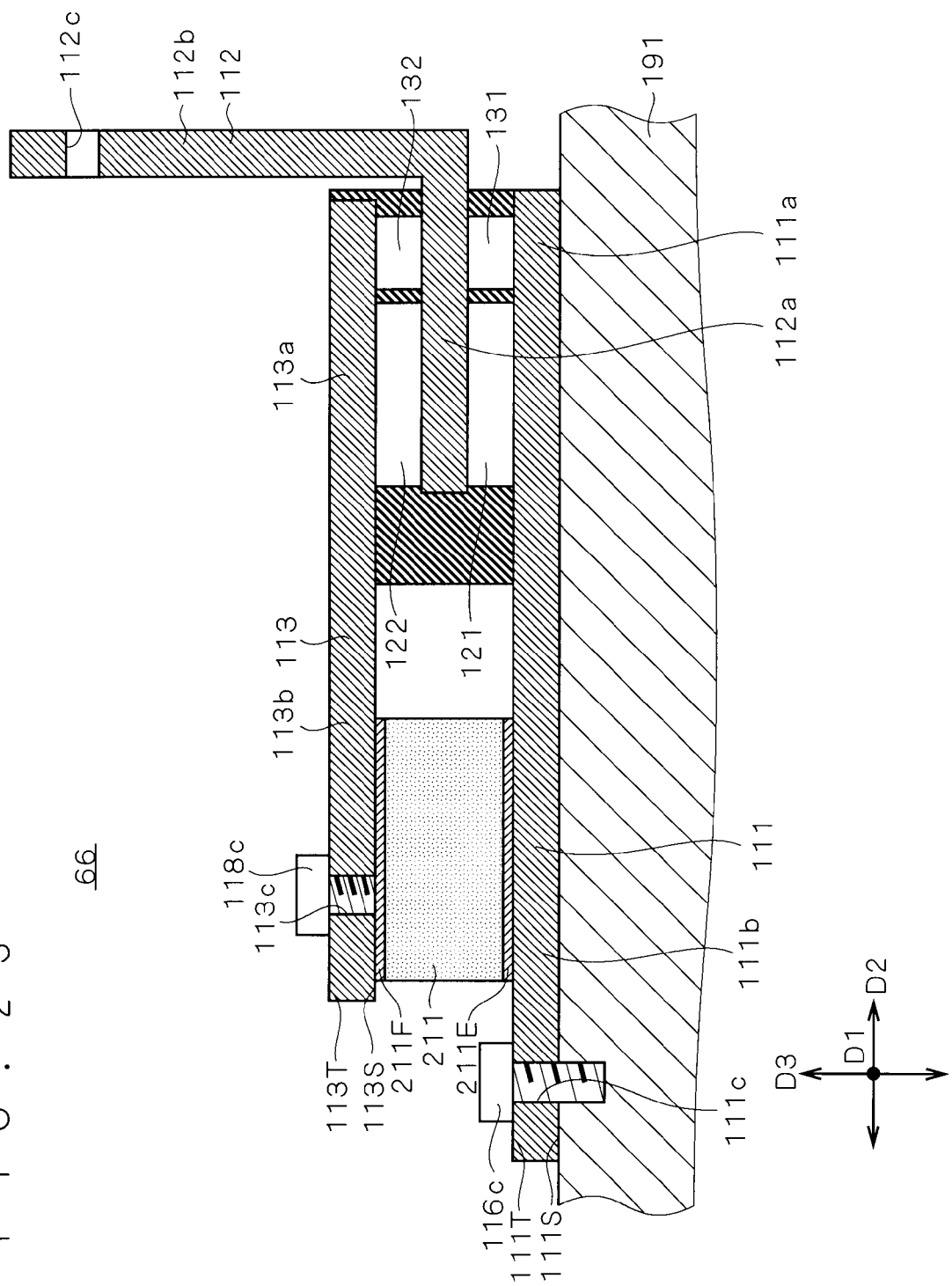
FIG. 23 is a schematic cross section illustrating a first power semiconductor device in accordance with a sixth preferred embodiment.

FIG. 23 is a schematic cross section illustrating a basic structure of a first power semiconductor device 66 in accordance with the sixth preferred embodiment. The power semiconductor device 66 basically has a structure combining the power semiconductor device 61 of FIG. 18 and a smoothing capacitor 211.

In more detail, in the power semiconductor device 66, the first and third terminal members 111 and 113 are each made of a plate-like material and disposed so that the external connection portions 111b and 113b thereof may be opposed to each other in the third direction D3. The smoothing capacitor 211 is sandwiched between the external connection portions 111b and 113b of the first and third terminal members 111 and 113, and a first electrode 211E of the smoothing capacitor 211 is in contact with the second main surface 111T of the external connection portion 111b of the first terminal member 111 and a second electrode 211F of the smoothing capacitor 211 is in contact with the first main surface 113S of the external connection portion 113b of the third terminal member 113. The smoothing capacitor 211 is thereby electrically connected to the first and third terminal members 111 and 113. The first electrode 211E and the second electrode 211F of the smoothing capacitor 211 are opposed to each other with the capacitor body interposed therebetween.

The smoothing capacitor 211 is fixed to the first and third terminal members 111 and 113 by soldering the first electrode 211E and the second electrode 211F to the second main surface 111T and the first main surface 113S or using the external-thread insertion holes 111c and 113c.

By making the length of the external connection portion 113b of the third terminal member 113 shorter than that of the external connection portion 111b of the first terminal member 111 and shifting the positions of the external-thread insertion holes 111c and 113c, for example, it is possible to perform screwing onto the heat sink 191 and the smoothing capacitor 211 continuously from the same direction and thereby increase productivity. Further, by disposing the first and third terminal members 111 and 113 so that the external-thread insertion holes 111c and 113c may be formed in a vertical direction and screwing the terminal members, it is possible to eliminate the need for supporting the screws 116c and 118c, the smoothing capacitor 211 and the heat sinks 191, 192 and the like at the same time in screwing operation and thereby increase productivity. The power semiconductor device 61 of FIG. 18 also produces these effects of increasing productivity.

Other constituents of the power semiconductor device 66 are the same those of the power semiconductor devices 51 and 61.

The power semiconductor device 66 allows the smoothing capacitor 211 to be provided between the first and third terminal members 111 and 113 in circuitry without using any wire. Therefore, it is possible to solve the problems caused by wire connection (which would be caused similarly to the problems of the background art caused by connection using the wire 154P) in mounting the smoothing capacitor 211. Further, since the smoothing capacitor 211 is sandwiched between the first and third terminal members 111 and 113, it is possible to mount the smoothing capacitor 211 firmly against vibration or external force.

Figure 24:
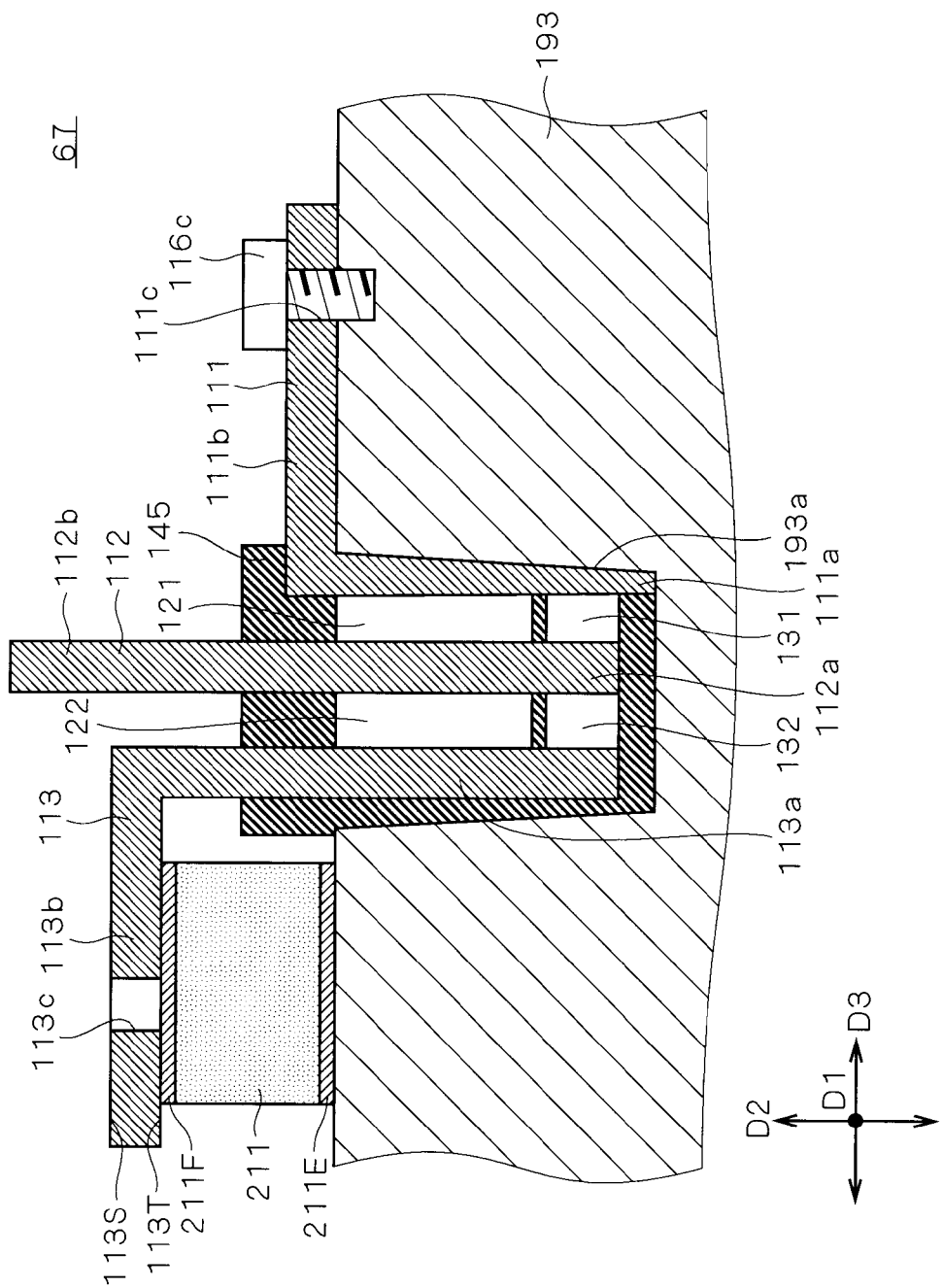
FIG. 24 is a schematic cross section illustrating a second power semiconductor device in accordance with the sixth preferred embodiment.

FIG. 24 is a schematic cross section illustrating a basic structure of a second power semiconductor device 67 in accordance with the sixth preferred embodiment. The power semiconductor device 67 basically has a structure in which the smoothing capacitor 211 is additionally provided in the earlier-discussed power semiconductor device 62 of FIG. 19.

Specifically, in the power semiconductor device 67, the external connection portion 113b of the third terminal member 113 is disposed so that the second main surface 113T thereof may be opposed to the heat sink 193. The heat sink 193 has conductivity and the smoothing capacitor 211 is disposed between the heat sink 193 and the external connection portion 113b of the third terminal member 113. In this case, the first electrode 211E of the smoothing capacitor 211 is in contact with the heat sink 193 and the second electrode 211F of the smoothing capacitor 211 is in contact with the second main surface 113T of the external connection portion 113b of the third terminal member 113. The smoothing capacitor 211 is fixed by, e.g., soldering or screwing. The smoothing capacitor 211 is thereby electrically connected to the heat sink 193 and the third terminal member 113.

The power semiconductor device 67 also produces the same effects as the power semiconductor device 66.

Further, the smoothing capacitor 211 can be provided when the external connection portions 111b and 113b of the first and third terminal members 111 and 113 are opposed to each other or the external connection portion 113b of the third terminal member 113 is opposed to the conductive heat sink 193 or 194. In other words, th smoothing capacitor 211 can be also connected to the earlier-discussed power semiconductor devices 51, 53 to 59 and 63 to 65. Furthermore, the smoothing capacitor 211 can be also connected between the first and third elastic members 111 and 113 even in the power semiconductor device 52 of FIG. 6 by shortening the length of the external connection portion 112*b* of the second terminal member 112 or designing plane pattern for the connection.

The First Variation Common to the First to Sixth Preferred Embodiments

Though the power semiconductor devices 51 to 67 each include the transfer mold package in the first to sixth preferred embodiments, a case-type package which is molded in advance may be used and a power semiconductor device using this type package can produce the same effects. In the present variation, as an example, a power semiconductor device 68 having a structure in which the transfer mold package 141 in the power semiconductor device 51 (see FIGS. 2 and 3) is replaced by a case-type package will be discussed. FIG. 25 is a schematic cross section illustrating a basic structure of the power semiconductor device 68.

A case 148 which is a case-type package of the power semiconductor device 68 is a frame with openings whose size is so large as to house the IGBTs 121 and 122 and the diodes 131 and 132, and is made of an insulating material such as resin. In the power semiconductor device 68, the element arrangement portion 111*a* of the first terminal member 111 is so disposed as to cover one opening of the frame and the first terminal member 111 is formed in the insulating case 148 by insert molding. The second and third terminal members 112 and 113 are attached to the insulating case 148 with, e.g., screws.

The insulating case 148 is filled with an insulating filler material 149 such as epoxy resin or silicone gel, and the IGBTs 121 and 122 and the diodes 131 and 132 housed in the insulating case 148 are sealed therewith. Further, there may be a case where the IGBTs 121 and 122 and the diodes 131 and 132 are covered with silicone gel and epoxy resin fills on the silicone gel, and in this case, the two-layer structure consisting of the silicone gel and the epoxy resin corresponds to the insulating filler material 149. In this case, the case-type package is formed of the insulating case 148 or the insulating case 148 and the insulating filler material 149. The insulating filler material 149 is disposed on the second main surface 113T of the element arrangement portion 113*a* of the third terminal member 113, and serves as an insulating portion opposed to the IGBT 122 and the diode 132 with the element arrangement portion 113*a* interposed therebetween.

The Second Variation Common to the First to Sixth Preferred Embodiments

Though the power semiconductor devices 51 to 68 each include the two first power semiconductor elements 121 and 131 and the two second power semiconductor elements 122 and 132, if diodes are used as the first and second power semiconductor elements, for example, a diode module is achieved as the power semiconductor device. Further, three or more elements may be used as each of the first and second power semiconductor elements.

The power semiconductor devices 51 to 68 may be applied to a motor control, e.g., like the power semiconductor device 50 of FIG. 1 or applied to an inverter of an air conditioner or the like or a power module used for an NC control or the like.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:

first to third terminal members each including an element arrangement portion having first and second main surfaces which are opposed to each other;

at least one first power semiconductor element having first and second main surfaces which are opposed to each other and first and second main electrodes provided on said first and second main surfaces, respectively; and at least one second power semiconductor element having first and second main surfaces which are opposed to each other and first and second main electrodes provided on said first and second main surfaces, respectively, wherein said at least one first power semiconductor element has the same structure as said at least one second power semiconductor element, said second main surface in said element arrangement portion of said first terminal member is joined to said first main electrode of said at least one first power semiconductor element, said second main electrode of said at least one first power semiconductor element is joined to said first main surface in said element arrangement portion of said second terminal member, said second main surface in said element arrangement portion of said second terminal member is joined to said first main electrode of said at least one second power semiconductor element, and said second main electrode of said at least one second power semiconductor element is joined to said first main surface in said element arrangement portion of said third terminal member, said power semiconductor device further comprising a package for housing said at least one first power semiconductor element and said at least one second power semiconductor element, wherein said first to third terminal members each have an external connection portion drawn out of said package.

2. The power semiconductor device according to claim 1, wherein said package includes a transfer mold package.

3. The power semiconductor device according to claim 1, wherein said at least one first power semiconductor element includes a first switching power semiconductor element having said first and second main electrodes; and a first free wheeling diode connected in inverse parallel to said first switching power semiconductor element, having said first and second main electrodes, and said at least one second power semiconductor element includes a second switching power semiconductor element having said first and second main electrodes; and a second free wheeling diode connected in inverse parallel to said second switching power semiconductor element, having said first and second main electrodes.

4. The power semiconductor device according to claim 1, wherein at least one main surface among said first main surface of said element arrangement portion in said first terminal member and said second main surface of said element arrangement portion in said third terminal member is exposed out of said package.

5. The power semiconductor device according to claim 4, wherein said at least one main surface is continuous with said external connection portion without step.

6. The power semiconductor device according to claim 1, further comprising an insulating portion so disposed as to be opposed to said at least one first power semiconductor element with said first terminal member interposed therebetween and/or as to be opposed to said at least one second power semiconductor element with said third terminal member interposed therebetween.

7. The power semiconductor device according to claim 3, wherein said first switching power semiconductor element is opposed to said second free wheeling diode with said second terminal member interposed therebetween, and said second switching power semiconductor element is opposed to said first free wheeling diode with said second terminal member interposed therebetween.

8. The power semiconductor device according to claim 1, further comprising control circuits for said at least one first power semiconductor element and said at least one second power semiconductor element, being each disposed above said element arrangement portion of said first or third terminal member, wherein said control circuits each include
a circuit pattern made of brazing silver; and
a circuit component joined to said circuit pattern.

9. The power semiconductor device according to claim 8, further comprising a connector having terminals connected to said control circuits, being fixed to said first or third terminal member.

10. The power semiconductor device according to claim 4, wherein at least one of said first to third terminal members further has an external-thread insertion hole in said external connection portion.

11. A power semiconductor device comprising said power semiconductor device as defined in claim 1 as a base component, a heat sink having a recess, wherein said base component is inserted in said recess so that said at least one first power semiconductor element and said at least one second power semiconductor element are disposed in said recess.

12. The power semiconductor device according to claim 11, wherein either of said first and third terminal members is exposed out of said package in said recess.

13. A power semiconductor device comprising said power semiconductor device as defined in claim 3 as a base component, a heat sink having a recess, wherein said base component is inserted in said recess, and said first switching power semiconductor element and/or said second switching power semiconductor element are/is disposed on the side of a bottom in said recess, relatively to said first free wheeling diode and/or said second free wheeling diode.

14. The power semiconductor device according to claim 11, further comprising an elastic member disposed between said base component and a side surface of said recess, being in contact therewith, having thermal conductivity higher than that of air.

15. The power semiconductor device according to claim 11, wherein said heat sink has conductivity, and said first or third terminal member is connected to said heat sink in an equipotential manner while said third or first terminal member is not contact with said heat sink, said power semiconductor device further comprising a smoothing capacitor sandwiched between said external connection portion of said first or third terminal member and said heat sink, being electrically connected thereto.

16. The power semiconductor device according to claim 1, further comprising a smoothing capacitor sandwiched between said external connection portion of said first terminal member and said external connection portion of said third terminal member, being electrically connected thereto.

* * * * *